United States Patent
Xiao et al.

(10) Patent No.: US 11,659,779 B2
(45) Date of Patent: May 23, 2023

(54) MEMORY CELL AND METHOD OF FORMING THE SAME

(71) Applicants: Agency for Science, Technology and Research, Singapore (SG); National University of Singapore, Singapore (SG)

(72) Inventors: Wen Xiao, Singapore (SG); Wendong Song, Singapore (SG); Jun Ding, Singapore (SG); Ernult Franck Gerard, Singapore (SG)

(73) Assignees: Agency for Science, Technology and Research, Singapore (SG); National University of Singapore, Singapore (SG)

( * ) Notice: Subject to any disclaimer, the term of this patent is extended or adjusted under 35 U.S.C. 154(b) by 0 days.

(21) Appl. No.: 16/977,411

(22) PCT Filed: Mar. 8, 2019

(86) PCT No.: PCT/SG2019/050128
§ 371 (c)(1),
(2) Date: Sep. 1, 2020

(87) PCT Pub. No.: WO2019/190392
PCT Pub. Date: Oct. 3, 2019

(65) Prior Publication Data
US 2021/0013407 A1    Jan. 14, 2021

(30) Foreign Application Priority Data
Mar. 28, 2018    (SG) .......................... 10201802567Q

(51) Int. Cl.
*H10N 70/00*    (2023.01)
*H10N 70/20*    (2023.01)
*H01L 45/00*    (2006.01)

(52) U.S. Cl.
CPC .......... *H01L 45/1273* (2013.01); *H01L 45/08* (2013.01); *H01L 45/1233* (2013.01);
(Continued)

(58) Field of Classification Search
CPC . H01L 45/1273; H01L 45/08; H01L 45/1233; H01L 45/146; H01L 45/147
See application file for complete search history.

(56) References Cited

U.S. PATENT DOCUMENTS 8,067,762 B2    11/2011    Ho et al.
8,912,518 B2    12/2014    Chi et al.
(Continued)

FOREIGN PATENT DOCUMENTS

CN    107706205 A    2/2018
KR    10-2014-0026073 A    3/2014
(Continued)

OTHER PUBLICATIONS

Wong et al., Metal-Oxide RRAM, Proceedings of the IEEE, vol. 100, No. 6, Jun. 2012, pp. 1951-1970 (Year: 2012).*
(Continued)

*Primary Examiner* — Shih Tsun A Chou
(74) *Attorney, Agent, or Firm* — Shackelford, Bowen, McKinley & Norton, LLP

(57) ABSTRACT

Various embodiments may provide a memory cell. The memory cell may include an active electrode including an active electrode material. The memory cell may also include a first noble electrode contact with the active electrode, the first noble electrode being a patterned electrode including a noble electrode material. The memory cell may further include a resistive switching layer in contact with the active electrode and the first noble electrode. The memory cell may additionally include a second noble electrode including a
(Continued)

noble electrode material, the second noble electrode in contact with the resistive switching layer.

10 Claims, 20 Drawing Sheets

(52) U.S. Cl.
CPC .......... *H01L 45/146* (2013.01); *H01L 45/147* (2013.01); *H01L 45/16* (2013.01)

(56) References Cited

U.S. PATENT DOCUMENTS

| | | | |
|---|---|---|---|
| 8,912,523 | B2 | 12/2014 | Jo |
| 9,054,307 | B2 | 6/2015 | Wang et al. |
| 9,246,097 | B2 | 1/2016 | Wang et al. |
| 2007/0045694 | A1 | 3/2007 | Hsu |
| 2011/0024716 | A1 | 2/2011 | Bratkovski et al. |
| 2014/0175360 | A1 | 6/2014 | Tendulkar et al. |
| 2015/0069315 | A1* | 3/2015 | Shih .................... H01L 45/1233 257/4 |
| 2016/0233422 | A1 | 8/2016 | Jo et al. |
| 2017/0012083 | A1 | 1/2017 | Wang et al. |
| 2017/0053968 | A1 | 2/2017 | Sheng et al. |
| 2018/0013061 | A1* | 1/2018 | Fukumizu ............. H01L 45/146 |

FOREIGN PATENT DOCUMENTS

| | | |
|---|---|---|
| WO | 2016048327 A1 | 3/2016 |
| WO | 2017003959 A1 | 1/2017 |

OTHER PUBLICATIONS

J. Robertson et al., Schottky barrier heights of tantalum oxide, barium strontium titanate, lead titanate, and strontium bismuth tantalate, Appl. Phys. Lett. 74, 1168 (1999) (Year: 1999).*
International Search Report for International Application No. PCT/SG2019/050128 dated May 17, 2019, pp. 1-4.
Written Opinion of the International Searching Authority for International Application No. PCT/SG2019/050128 dated May 17, 2019, pp. 1-4.
Lee et al., "Time-Dependent Current-Voltage Curves During the Forming Process in Unipolar Resistance Switching," Applied Physics Letters, vol. 98, 053503, 2011, pp. 1-3.
Lee et al., "Resistive Switching Phenomena: A Review of Statistical Physics Approaches," Applied Physics Reviews, vol. 2, 031303, 2015, pp. 1-57.
Jeong et al., "Emerging Memories: Resistive Switching Mechanisms and Current Status," Reports on Progress in Physics, vol. 75, 076502, 2012, pp. 1-31.
Lee et al., "A Fast, High-Endurance and Scalable Non-Volatile Memory Device Made from Asymmetric Ta2O5-x/TaO2-Bilayer Structures," Nature Materials, vol. 10, Aug. 2011, pp. 625-630.
T. W. Hickmott, "Low-Frequency Negative Resistance in Thin Anodic Oxide Films," Journal of Applied Physics, vol. 33, No. 9, Sep. 1962, pp. 2669-2682.
Beck et al., "Reproducible Switching Effect in Thin Oxide Films for Memory Applications," Applied Physics Letters, vol. 77, No. 1, Jul. 3, 2000, pp. 139-141.
Liu et al., "Electric-Pulse-Induced Reversible Resistance Change Effect in Magnetoresistive Films," Applied Physics Letters, vol. 76, No. 19, May 8, 2000, pp. 2749-2751.
Guo et al., "Materials Selection for Oxide-Based Resistive Random Access Memories," Applied Physics Letters, vol. 105, 223516, 2014, pp. 1-5.
Seo et al., "Reproducible Resistance Switching in Polycrystalline NiO Films," Applied Physics Letters, vol. 85, No. 23, Dec. 6, 2004, pp. 5655-5657.
Yoshida et al., "High Speed Resistive Switching in Pt/TiO2/TiN Film for Nonvolatile Memory Application," Applied Physics Letters, vol. 91, 223510, 2007, pp. 1-3.
Sawa et al., "Resistive Switching in Transition Metal Oxides," Materials Today, vol. 11, No. 6, Jun. 2008, pp. 28-36.
Waser et al., "Redox-Based Resistive Switching Memories—Nanoionic Mechanisms, Prospects, and Challenges," Advanced Materials, vol. 21, 2009, pp. 2632-2663.
Park et al., "In Situ Observation of Filamentary Conducting Channels in an Asymmetric Ta2O5-x/TaO2-x Bilayer Structure," Nature Communications, Sep. 6, 2013, pp. 1-9.
Prakash et al., "TaOx-Based Resistive Switching Memories: Prospective and Challenges," Nanoscale Research Letters, vol. 8, No. 418, 2013, pp. 1-17.
Wong et al., "Metal-Oxide RRAM," Proceedings of the IEEE, vol. 100, No. 6, Jun. 2012, pp. 1951-1970.
Pimpin et al., "Review on Micro- and Nanolithography Techniques and their Applications," Engineering Journal, vol. 16, No. 1, Jan. 1, 2012, pp. 37-55.
Wang et al., "A Review on Inorganic Nanostructure Self-Assembly," Journal of Nanoscience and Nanotechnology, vol. 10, 2010, pp. 1563-1583.
Guo et al., "Robust 3-D Configurated Metal Oxide Nano-Array Based Monolithic Catalysts with Ultrahigh Materials Usage Efficiency and Catalytic Performance Tunability," Nano Energy, vol. 2, 2013, pp. 873-881.
Xiao et al., "Novel Room-Temperature Spin-Valve-Like Magnetoresistance in Magnetically Coupled Nano-Column Fe3O4/Ni Heterostructure," Nanoscale, vol. 8, 2016, pp. 15737-15743.
Zhang et al., "Recent Progress in Self-Supported Metal Oxide Nanoarray Electrodes for Advanced Lithium-Ion Batteries," Advanced Science, 1600049, 2016, pp. 1-29.
Herng et al., "Achieving a High Magnetization in Sub-Nanostructured Magnetite Films by Spin-Flipping of Tetrahedral Fe3+ Cations," Nano Research, vol. 8, No. 9, 2015, pp. 2935-2945.
Dong et al., "L10 FePt—ZrO2 (001) Nanostructured Films with High Aspect Ratio Columnar Grains," Applied Physics Letters, vol. 104, 192404, 2014, pp. 1-5.
Lee et al., "Tuning Ionic Transport in Memristive Devices by Graphene with Engineered Nanopores," ACS Nano, vol. 10, No. 3, Mar. 8, 2016, pp. 3571-3579.

\* cited by examiner

MEMORY CELL AND METHOD OF FORMING THE SAME

CROSS-REFERENCE TO RELATED APPLICATION

This application claims the benefit of priority of Singapore application No. 10201802567Q filed Mar. 28, 2018, the contents of it being hereby incorporated by reference in its entirety for all purposes.

TECHNICAL FIELD

Various aspects of this disclosure relate to a memory cell. Various aspects of this disclosure relate to a method of forming a memory cell.

BACKGROUND

High-performance computing technologies rely on high-speed and high-density memories and processors. The striding development of memories in the past decades is reflective of the booming semiconductor industry and drives the prevalence of personal computers. Nowadays, memories for mobile electronics constitute a rapidly growing portion of the semiconductor markets. In addition to high speeds and high densities, non-volatility and low power consumption are also required for memories used in portable electronic devices. Conventional random-access memories (RAMs), such as static random access memory (SRAM) and dynamic random access memory (DRAM), while exhibiting high speeds and long lifetimes, are relatively volatile and consume high power. Although read only memories (ROMs), such as Flash memory and one-time programmable read-only memory (OTPROM), are non-volatile with long retention time (>10 years), they suffer from low speeds (write/erase time from 1 μs to 1 ms), high operating voltages, and short lifetimes (~$10^5$ cycles).

In order to take the advantages of both RAM and ROM, overcome the scaling limit of conventional silicon-based devices, and further reduce power consumption, extensive effort has been devoted to develop the next-generation emerging non-volatile memories (NVMs), especially resistance-based memories, such as phase-change RAM (PCRAM), magnetic RAM (MRAM), ferroelectric RAM (FeRAM) and resistive switching RAM (RRAM). The resistance-based memories store information by switching the resistance between two non-volatile states, i.e. the "0" and "1" binary states. Different types of NVMs have different unique features and characteristics as a result of the respective resistive switching mechanisms. PCRAM changes resistance states by reversible phase change between amorphous and crystalline structures. MRAM operates between two resistance states by reversibly changing the relative magnetization orientations of ferromagnetic layers. FeRAM switches resistance states by reversing the remnant polarization of a ferroelectric capacitor.

Amongst the various emerging NVMs, RRAM is widely regarded as the most promising candidate for future low-power, high-speed and high-density non-volatile memory. Comparing to RRAM, PCRAM exhibits limited endurance (~$10^9$ cycles), high operating current and voltage and hence high power consumption (~10-12 J/bit). MRAM has improved endurance (~$10^{12}$ cycles), but requires large cell area (20 $F^2$) and also high operating power (~10-12 J/bit). Although FeRAM has good endurance (~$10^{14}$ cycles), its feature size (~180 nm) and cell area (~22 $F^2$) are particularly large. Thus, RRAM draws exceptional attention owing to the overall device characteristics, including small feature size (<5 nm), small cell area (4 $F^2$), short switching time (<1 ns), low operating voltage (<1 V) and low power consumption (~10-16 J/bit). In the current stage, the best reported endurance of RRAM is ~$10^{12}$ cycles. The switching uniformity and stability of RRAM remain obstacles to the widespread adoption of RRAM.

SUMMARY

Various embodiments may provide a memory cell. The memory cell may include an active electrode including an active electrode material. The memory cell may also include a first noble electrode contact with the active electrode, the first noble electrode being a patterned electrode including a noble electrode material. The memory cell may further include a resistive switching layer in contact with the active electrode and the first noble electrode. The memory cell may additionally include a second noble electrode including a noble electrode material, the second noble electrode in contact with the resistive switching layer.

Various embodiments may provide a method of forming a memory cell. The method may include forming an active electrode including an active electrode material. The method may also include forming a first noble electrode in contact with the active electrode, the first noble electrode being a patterned electrode including a noble electrode material. The method may further include forming a resistive switching layer in contact with the active electrode and the first noble electrode. The method may also include forming a second noble electrode including a noble electrode material, the second noble electrode in contact with the resistive switching layer.

BRIEF DESCRIPTION OF THE DRAWINGS

The invention will be better understood with reference to the detailed description when considered in conjunction with the non-limiting examples and the accompanying drawings, in which.

DETAILED DESCRIPTION

Figure 1A:
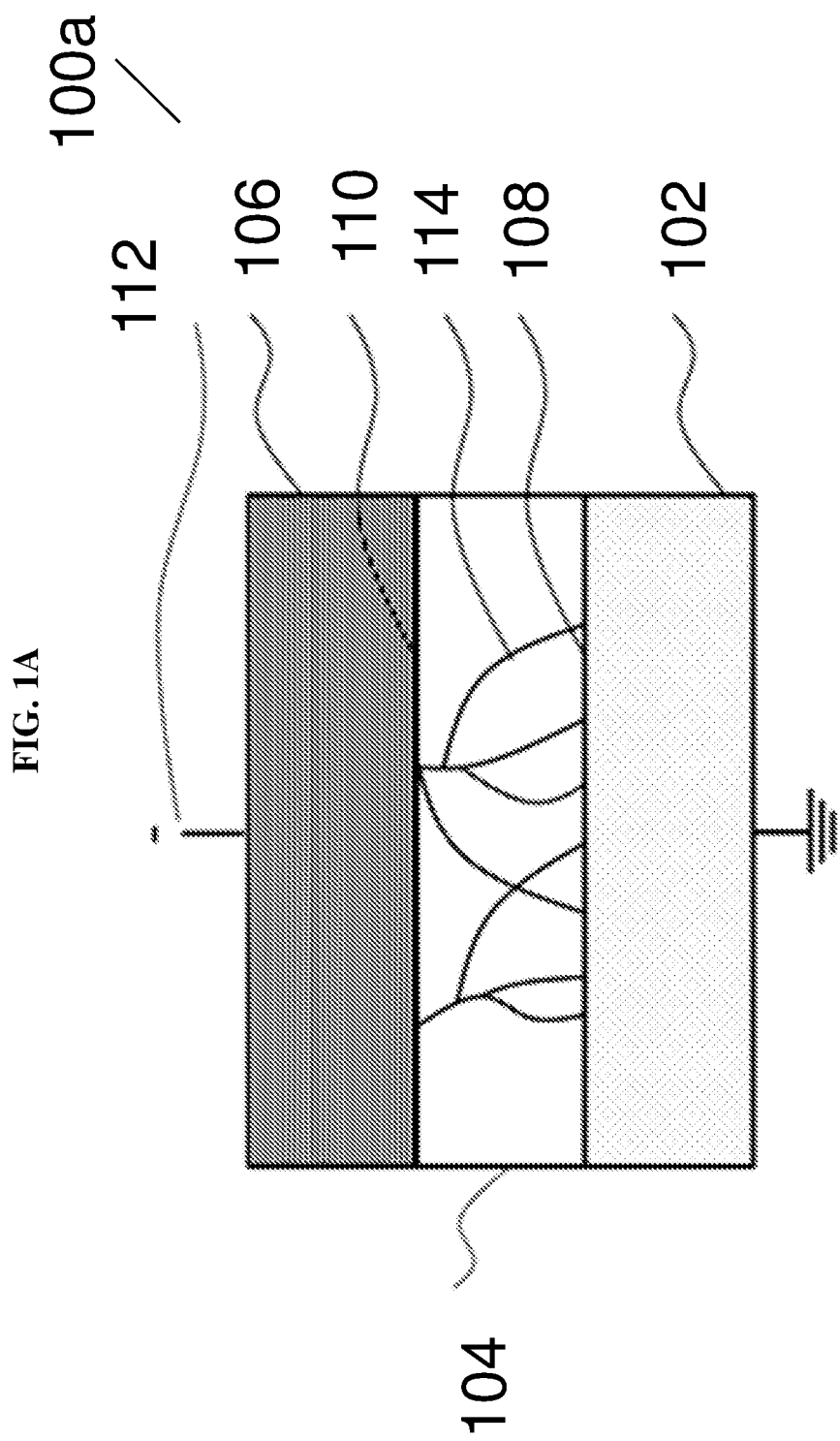
FIG. 1A shows a schematic of a conventional asymmetric resistive random access memory (RRAM) cell with an active electrode and a noble electrode.

The following detailed description refers to the accompanying drawings that show, by way of illustration, specific details and embodiments in which the invention may be practiced. These embodiments are described in sufficient detail to enable those skilled in the art to practice the invention. Other embodiments may be utilized and structural, and logical changes may be made without departing from the scope of the invention. The various embodiments are not necessarily mutually exclusive, as some embodiments can be combined with one or more other embodiments to form new embodiments.

Embodiments described in the context of one of the methods or memory cells are analogously valid for the other methods or memory cells. Similarly, embodiments described in the context of a method are analogously valid for a memory cell, and vice versa.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may also be used herein to mean that the deposited material may be formed "indirectly on" the implied side or surface with one or more additional layers being arranged between the implied side or surface and the deposited material. In other words, a first layer "over" a second layer may refer to the first layer directly on the second layer, or that the first layer and the second layer are separated by one or more intervening layers. Further, in the current context, a layer "over" or "on" a side or surface may not necessarily mean that the layer is above a side or surface. A layer "on" a side or surface may mean that the layer is formed in direct contact with the side or surface, and a layer "over" a side or surface may mean that the layer is formed in direct contact with the side or surface or may be separated from the side or surface by one or more intervening layers.

The memory cells as described herein may be operable in various orientations, and thus it should be understood that the terms "top", "topmost", "bottom", "bottommost" etc., when used in the following description are used for convenience and to aid understanding of relative positions or directions, and not intended to limit the orientation of the memory cells.

In the context of various embodiments, the articles "a", "an" and "the" as used with regard to a feature or element include a reference to one or more of the features or elements.

In the context of various embodiments, the term "about" or "approximately" as applied to a numeric value encompasses the exact value and a reasonable variance.

As used herein, the term "and/or" includes any and all combinations of one or more of the associated listed items.

As highlighted above, conventional RRAM have poor switching characteristics, such as switching uniformity and stability. Therefore, improving the switching characteristics, especially uniformity, e.g. by design of cell architecture and selection of material, may be required for future commercialization of RRAM.

The initial design of resistive random-access memory (RRAM) originates from the resistive switching behavior of various insulators. The phenomenon was firstly reported in 1962 and caught tremendous attention in the past 10 years for developing next-generation universal memories or memristive devices. In a typical resistive switching material, two reversible resistance states coexist for information storage and processing. The two reversible states may be referred to as the high-resistance state (HRS) and the low-resistance state (LRS). The HRS can be electrically switched to the LRS (namely "set") and the LRS can be switched to the HRS (namely "reset") by applying voltage biases. The resistive switching process may be required to possess uniform switching voltages, low operating power, long endurance and retention, short switching time, and so on, posing great challenges in terms of materials selection, structural design and scalable manufacture.

A number of insulating materials, such as oxides, nitrides, chalcogenides, and organic materials, possess resistive switching phenomenon. Oxides attract particular interest due to their excellent complementary metal-oxide-semiconductor (CMOS) compatibility, chemical stability and resistive switching characteristics. In 1962, $Al_2O_3$ was firstly reported to exhibit resistive switching behavior, which initiated the early investigation of resistive switching. In 2000, two-terminal devices of Cr-doped $SrZrO_3$ film and $Pr_{0.7}Ca_{0.3}MnO_3$ film were reported to be suitable for resistive switching devices. The simple two-terminal structure demonstrates great potential for next-generation high-density non-volatile memory device and leads to enormous efforts to identify and understand memory materials. For instance, a previous application describing a general way to select memory materials, which should have an inner orbital less than a full quota of electrons and a narrow, outer conductive orbital, especially transition metal oxides or materials with long relaxation time, such as $ZrO_2$, NiO, $TiO_2$, ZnO, $Nb_2O_5$, $Ta_2O_5$, $Al_2O_3$, $SrTiO_3$, $SrZrO_3$, $SrTiZrO_3$, $Pr_{0.7}Ca_{0.3}MnO_3$ (PCMO), $PbZr_{1-x}Ti_xO_3$, and so on, has been filed.

In addition, there have been prior applications relating to suitable electrode materials. It has also been found that symmetric RRAM cells, each including two noble electrodes and a memory material, usually possess unipolar switching characteristics, where the set and reset occur with a single polarity of external voltages. The unipolar symmetric RRAM cell may require high forming voltages with electric fields close to the threshold for dielectric breakdown to initialize the resistive switching.

On the other hand, asymmetric RRAM cells with one noble electrode and one active electrode normally exhibit bipolar resistive switching, where set and reset occur with different polarities of external voltages. Bipolar RRAM cells with asymmetric structures may have superior resistive switching characteristics, including low operating voltages, small current densities and, most importantly, excellent endurance (~$10^{12}$ cycles).

The basic structure of a RRAM cell may include a layer of insulating memory material (i.e. a dielectric layer) sandwiched by two conductive electrodes (top electrode and bottom electrode) to form a simple metal-insulator-metal (MIM) two-terminal device. Depending on the top electrode and the bottom electrode used, the MIM structure may be either symmetric (when both electrodes are noble) or asymmetric (when one electrode is noble and the other is active). As highlighted above, symmetric RRAM cells may be unipolar and may have poor switching uniformity, stability and endurance.

There has been previous work done to improve the resistive switching performance of asymmetric multilayer structures. Asymmetric bilayer oxide structures with distinct oxygen deficiency have previously been proposed to improve forming and operating characteristics of RRAM cells. A prior application describes the combination of high work function metal oxide and low work function rare earth metal at the interfaces between memory and electrode materials. The asymmetric structure forms a good Schottky barrier at the high workfunction interface leading to high on/off ratio.

Although noble electrodes, such as platinum (Pt) and gold (Au), can form an inert interface with memory material and function as an ion diffusion barrier, they cannot be etched and are often difficult to integrate with complementary metal oxide semiconductor (CMOS) processes. Another prior application describes the insertion of diffusion barrier layers between memory and electrode materials to form an inert interface, which enables the use of CMOS compatible electrode materials as alternatives to the noble materials. Moreover, yet another prior application describes a dielectric layer between electrode and memory materials to enhance the data retention of RRAM cell. Other prior applications describe an additional layer of resistive doped metal oxides/nitrides or metal alloys between electrode and memory materials to limit the switching current and allow scaling down the cell dimensions.

Extensive studies on resistive switching devices have reported that the switching process depends on a number of parameters, including switching and electrode materials, cell dimensions, fabrication process conditions, operating voltage and current, and so on. Consequently, various mechanisms have been proposed based on the individual observations. The switching mechanisms can be generally categorized into filament type and interface type. Additionally, cation-based (electrochemical metallization, ECM) and anion-based (valance change memory, VCM) resistive switching mechanisms based on the chemical states of the conducting materials have been proposed. The high-endurance $Ta_2O_{5-x}$-based resistive switching process, for instance, adopts an anion-based filament-type mechanism as a result of voltage-controlled redox reactions of $Ta_2O_{5-x}$. The oxidation and reduction of $Ta_2O_{5-x}$ controlled by electric field or thermal induced ionic ($O^{2-}$) migration result in the formation and rupture of conducting paths/channels and switching between LRS and HRS.

A prior application also describes a layer of dielectric material between electrode and memory materials, which is configured to electrically breakdown in certain localized regions under an electroforming voltage. The dielectric breakdown creates localized metal regions in the dielectric layers, which further control the formation of conducting channel. Another prior application describes the use of a memory dielectric layer having a recess at one interface between electrode and memory materials. Conducting channels form favorably in the memory dielectric layer under the recess. Yet another prior application describes generation of conducting channels distributed uniformly in the switching memory layer by ion implantation or radiation damage including electromagnetic photons, neutral particles, electrons and ultrasound.

FIG. 1A shows a schematic of a conventional asymmetric resistive random access memory (RRAM) cell 100a with an active electrode 102 and a noble electrode 106. The asymmetric RRAM cell has a resistive switching layer 104 sandwiched by the top noble electrode 106 and the bottom active electrode 102. The patterned dots in active electrode 102 represent the active electrode material, while the horizontal lines in noble electrode 106 represent the noble electrode material. The resistive switching layer 104 forms an active interface 108 with the bottom active electrode 102, and a noble interface 110 with the top noble electrode 106. In general, the noble electrode materials may be electrically conductive materials and resistive to oxidization, leading to a highly oxidation resistive noble interface. In addition, noble electrode materials may have a high work function forming a high Schottky barrier with the resistive switching layer 104. On the contrary, active electrode materials may be electrically conductive materials and generally have high relative reactivity with respect to oxygen. The active interface 108 formed between the active electrode 102 and the resistive switching layer 104 may be reactive and may serve as an ion reservoir to facilitate the generation of defects in the resistive switching layer 104 in the presence of an electric field.

When an external voltage 112 is applied across electrodes 102, with a particular polarity, there is ionic migration in the switching layer driven by the applying electric field. Meanwhile, chemical reactions may take place at the interfaces 108, 110, most commonly at the active interface 108. The reaction may be oxidization, reduction, or a redox reaction, and may involve migration of ionic species at the interface 108. The ion migration in the switching layer 104 and ion consumption at the active interface 108 may aid the formation of conduction paths 114 which give rise to the low resistance state (LRS) of the RRAM cell 100a. The conduction paths 114 may generally form under a small applied voltage less than 3 V or even less than 1 V in some cases. When an external voltage 112 of a reversed polarity, i.e. an opposite polarity, is applied, the conduction paths 114 may be ruptured and may become discontinuous, which give rise to the high resistance state (HRS) of the cell 100a. Notably, for the asymmetric cell 100a, the conduction paths 114 may form at any position(s) randomly in the switching layer 104. The random formation of conduction paths 114 may result in large-area and unpredictable conducting regions, leading to high switching current, unstable switching voltages, and deteriorated switching uniformity.

Figure 1B:
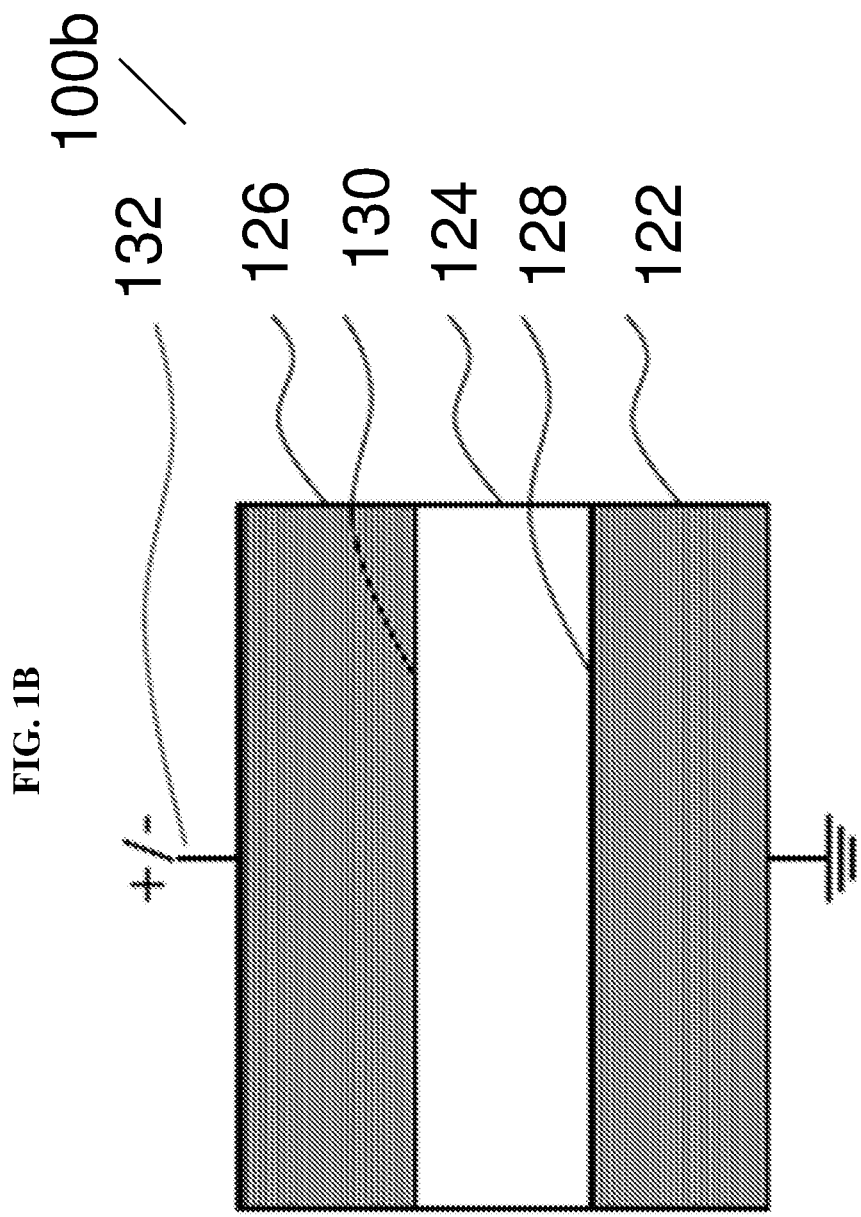
FIG. 1B illustrates a conventional symmetric resistive random access memory (RRAM) cell with noble electrodes.

FIG. 1B illustrates a conventional symmetric resistive random access memory (RRAM) cell 100b with noble electrodes 122, 126. The noble electrodes 122, 126 may or may not be of the same material. The bottom noble electrode 122 may form a noble interface 128 with the resistive switching layer 124, while the top noble electrode 126 may form a noble interface 130 with the resistive switching layer 124. The noble interfaces 128, 130 may be highly inert and may not take part in reactions even under high electric field. Thus, the two noble interfaces may create a closed system within the resistive switching layer, confining ionic species and hindering the ionic migration. Conduction paths may not form in the noble-noble symmetric architecture with two noble electrodes 122, 126, even under high applying voltage of either polarity 132. The symmetric RRAM cell 100b may always remain at HRS and may work effectively as a current blocker.

Figure 1C:
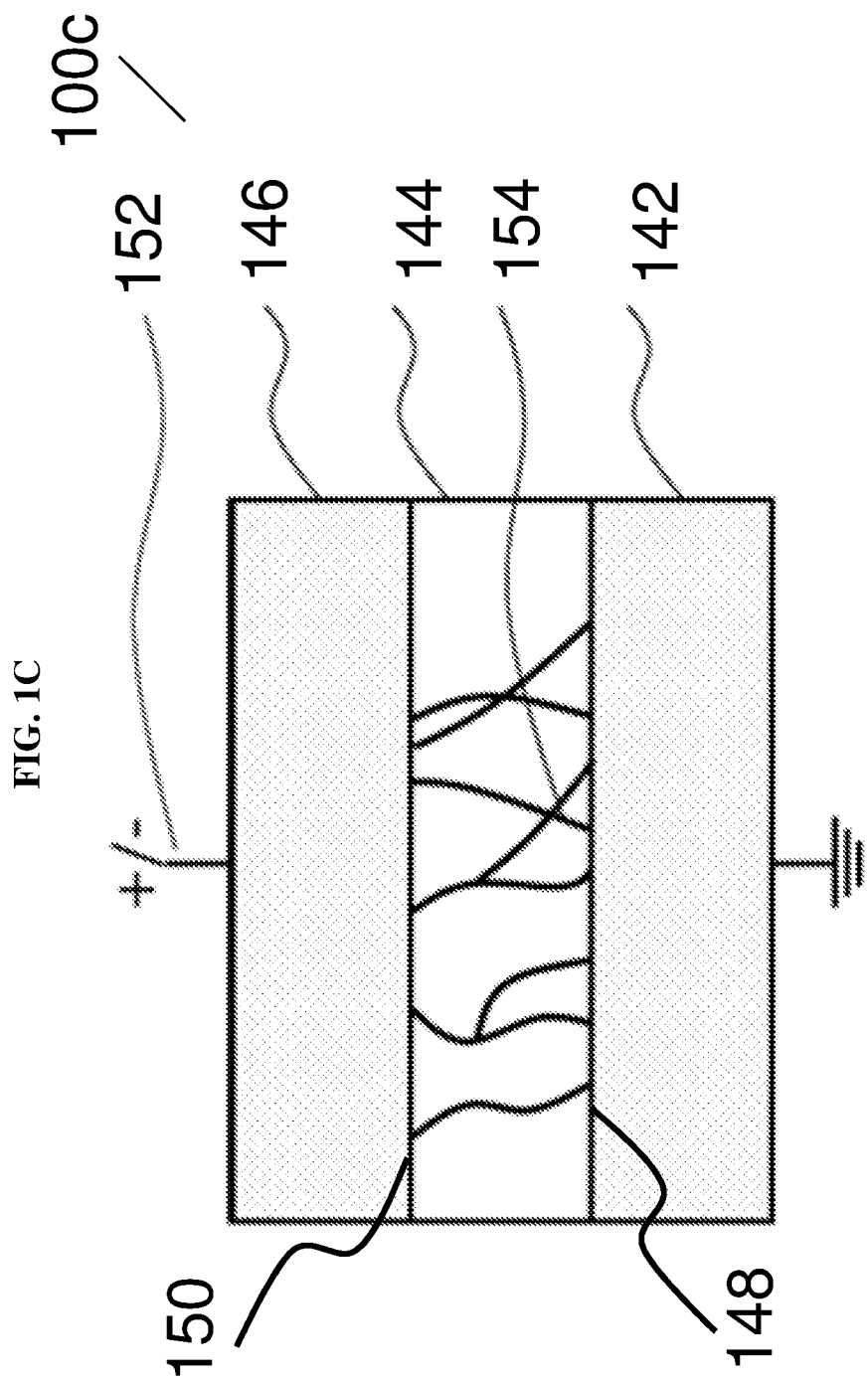
FIG. 1C illustrates a conventional symmetric resistive random access memory (RRAM) cell with active electrodes.

FIG. 1C illustrates a conventional symmetric resistive random access memory (RRAM) cell 100c with active electrodes 142, 146. The active electrodes 142, 146 may sandwich a resistive switching layer 144. The bottom active electrode 142 may form an active interface 148 with the resistive switching layer 144, while the top active electrode 146 may form an active interface 150 with the resistive switching layer 144. When an external voltage 152 of any polarity is applied, permanent conducting channels 154 may form in the resistive switching layer 144, resulting in a low resistance state (LRS). Notably, the LRS may be permanent and irreversible. The cell 100c may not be switched back to HRS by an external voltage 152 of any polarity. Thus, the active-active symmetric architecture may suffer from permanent dielectric breakdown and may lead to electrical short circuit, which should be avoided in RRAM cells.

As highlighted above, the asymmetric cell 100a shown in FIG. 1A may switch between a LRS and a HRS. However, the formation of conduction paths 114 may be random and physically uncontrollable. The random and uncontrollable formation of conduction paths 114 may result in resistive switching instability and high power consumption, giving rise to non-uniform set voltages and LRS resistance, and high operating current.

Various embodiments may seek to address or mitigate the abovementioned issues. Various embodiments may provide a memory cell with lower power consumption and//or lower operating current. Various embodiments may provide a memory cell with more uniform set voltages and/or LRS resistance. Various embodiments may provide a memory cell with more predictable and controllable conduction paths.

Figure 2:
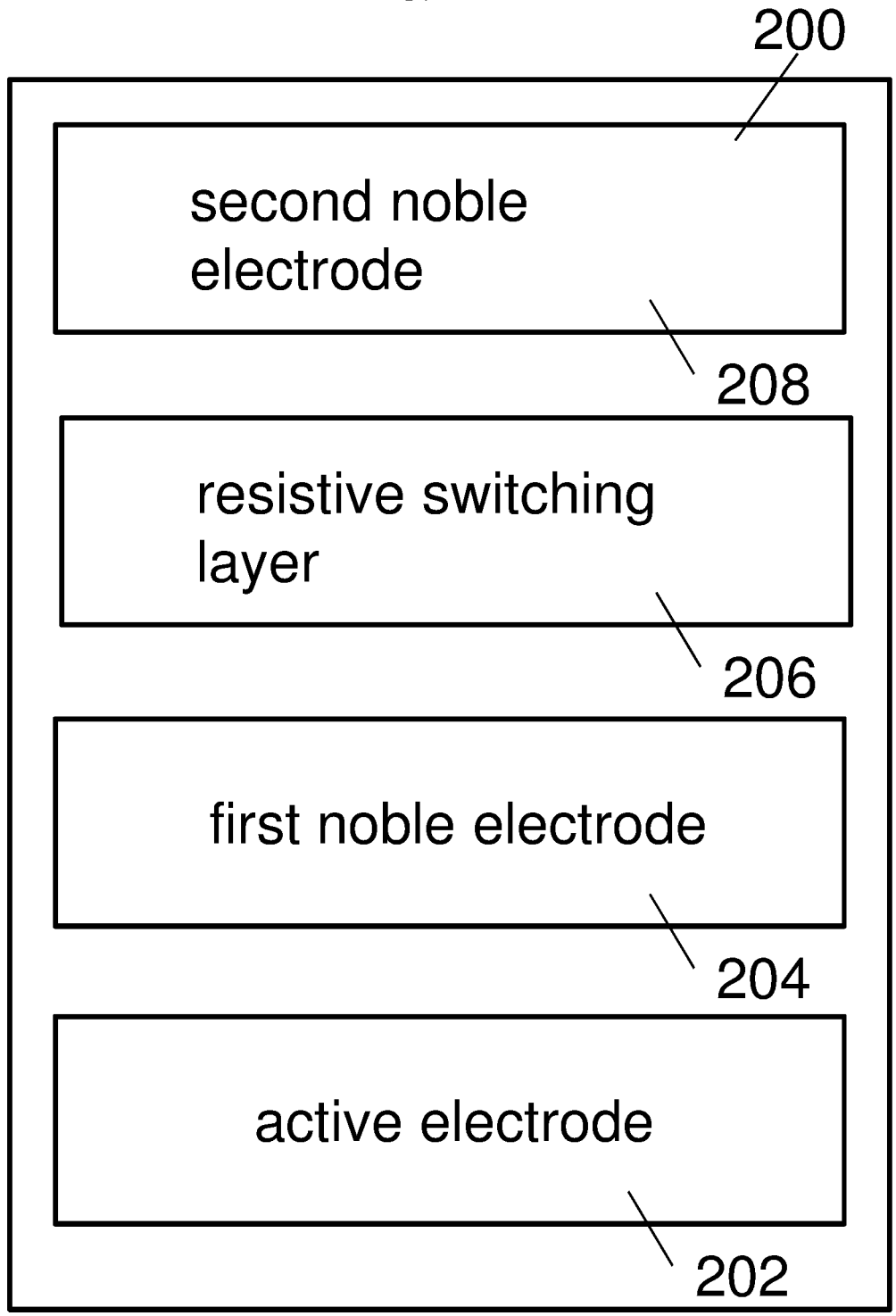
FIG. 2 is a general illustration of a memory cell according to various embodiments.

FIG. 2 is a general illustration of a memory cell 200 according to various embodiments. The memory cell 200 may include an active electrode 202 including an active electrode material. The memory cell 200 may also include a first noble electrode 204 in contact with the active electrode 202, the first noble electrode 204 being a patterned electrode including a noble electrode material. The memory cell 200 may further include a resistive switching layer 206 in contact with the active electrode 202 and the first noble electrode 204. The memory cell 200 may additionally include a second noble electrode 208 including a noble electrode material, the second noble electrode in contact with the resistive switching layer 206.

In other words, the memory cell 200 may include a resistive switching layer 206 sandwiched by the second noble electrode 208 and a hybrid noble-active electrode structure. The hybrid noble-active electrode structure may include an active electrode 202 and a first noble electrode 204, which may be patterned. The patterned first noble electrode 204 may define channels to contain portions of the resistive switching layer 206 so that the resistive switching layer 206 is in contact with both the active electrode 202 and the first noble electrode 204.

For avoidance of doubt, FIG. 2 serves to highlight features of the memory cell 200 according to various embodiments, and does not serve to limit or illustrate the arrangement, orientation, sizes, shapes etc. of the features or the memory cell.

In various embodiments, the memory cell 200 may be a resistive random access memory (RRAM) cell. In various embodiments, the resistive switching layer 206 may include an oxide material. The oxide material may be, for instance, a transition metal oxide, or a perovskite oxide. Examples of oxide materials may include $ZrO_2$, $NiO$, $TiO_2$, $ZnO$, $Nb_2O_5$, $Ta_2O_5$, $Al_2O_3$, $SrTiO_3$, $SrZrO_3$, $SrTiZrO_3$, $Pr_{0.7}Ca_{0.3}MnO_3$ (PCMO), $PbZr_{1-x}Ti_xO_3$ etc. The resistive switching layer 206 may be configured so that one or more conduction paths are formed when a potential difference is applied across the resistive switching layer 206.

In various embodiments, the memory cell 200 may referred to as a symmetric-asymmetric hybrid RRAM cell. The memory cell may include a symmetric arrangement or portion formed by the first noble electrode 204, the resistive switching layer 206, and the second noble electrode 208, as well as an asymmetric arrangement or portion formed by the active electrode 202, the resistive switching layer 206 and the second noble electrode 208.

The memory cell 200 may be configured so that the one or more conduction paths are formed in the resistive switching layer 206 when a first voltage or potential difference is applied along a first direction across the resistive switching layer 206 (i.e. across active electrode 202 and second noble electrode 208), and the one or more conduction paths in the resistive switching layer 206 are disrupted when a voltage or second potential difference is applied along a second direction opposite the first direction across the resistive switching layer 206 (i.e. across active electrode 202 and second noble electrode 208). Various embodiments may seek to physically confine formation of conduction paths, e.g. via structural design and/or materials selection, to improve cell performance.

In the current context, a noble electrode material may be a material that is relatively resistant to or unreactive with oxygen. The noble electrode material may be an electrically conductive material. A noble electrode material may include, but may not be limited to, a noble metal such as gold (Au), platinum (Pt), ruthenium (Ru), rhodium (Rh), palladium (Pd), silver (Ag), osmium (Os), and iridium (Ir). In various other embodiments, the noble electrode material may for instance be a conductive oxide such as iron oxide or iridium oxide, a conductive nitride such as titanium nitride or tantalum nitride, or any other suitable material(s) with a resistivity less than $10^{-2}$ Ωcm. In various embodiments, the noble electrode material of the first noble electrode 204 and the noble material electrode material of the second noble electrode 208 may be selected from a group consisting of noble metals, conductive oxides, and conductive nitrides. In various embodiments, the first noble electrode 204 and the resistive switching layer 206 may form a Schottky barrier of 1.2 eV or above. In various embodiments, the second noble electrode 208 and the resistive switching layer 206 may form a Schottky barrier of 1.2 eV or above.

In various embodiments, the noble electrode material of the first noble electrode 204 may be same as the noble electrode material of the second noble electrode 208. In various other embodiments, the noble electrode material of the first noble electrode 204 may be different from the noble electrode material of the second noble electrode 208.

In the current context, an active electrode material may be a material that has a relatively high reactivity with respect to oxygen. The active electrode material may be an electrically conductive material. The active electrode 202 may be configured to form an active interface with the resistive switching layer 206 that is reactive and serves as an ion reservoir to facilitate the generation of defects in the resistive switching layer 206 in the presence of an electric field (generated by the voltage or potential difference applied along the first direction). The active material may be an active metal or an active metal alloy. An electrode material may include, but may not be limited to, polysilicon, titanium (Ti), nickel (Ni), tantalum (Ta), hafnium (Hf), aluminum (Al) etc. In various embodiments, the active electrode 202 and the resistive switching layer 206 may form a Schottky barrier of 1.1 eV or below.

In the current context, a "patterned electrode" may refer to an electrode having a pattern with features having one or more dimensions each less than 100 nm.

In various embodiments, the patterned first noble electrode 204 may include a plurality of nanostructures. In the current context, a nanostructure may be a structure that has at least one dimension that is of 100 nm or less. The nanostructure may also be a structure that has two dimension or three dimension that is each of 100 nm or less. The plurality of nanostructures may be isolated or separated from one another. The conduction paths may be formed on portions of the resistive switching layer 206 between the plurality of nanostructures. Thus, the plurality of nanostructures may define conducting or conduction channels for constricting the formation of conduction paths.

In various other embodiments, the patterned first noble electrode 204 may be a continuous structure such as a grid, which includes a plurality of openings which may hold portions of the resistive switching layer 206. The conduction paths formed may pass through portions of the resistive switching layer 206 within the plurality of openings. Thus, the grid may define conducting or conduction channels for constricting the formation of conduction paths.

The second noble electrode 208 may be an unpatterned electrode or a continuous electrode. The active electrode 202 may be an unpatterned electrode or a continuous electrode. In the current context, an unpatterned electrode may refer to an electrode without a pattern having features having one or more dimensions each less than 100 nm. A continuous electrode may refer to a single integral electrode. For instance, the second noble electrode 208 and/or the active electrode 202 may be single integral continuous structure(s), with unpatterned, planar or flat surfaces.

In various embodiments, the plurality of nanostructures may be any one or more types of nanostructures selected from a group consisting of nanoparticles, nanocolumns, and nanograins. In various other embodiments, the plurality of nanostructures may be or may include any other types of nanostructures.

In various embodiments, the plurality of nanostructures may be of a random arrangement. In various other embodiments, the plurality of nanostructures may be arranged in an array, e.g. a periodic or an aperiodic array.

In various embodiments, the resistive switching layer may extend between neighboring nanostructures of the plurality of nanostructures to be in contact with the active electrode.

Figure 3:
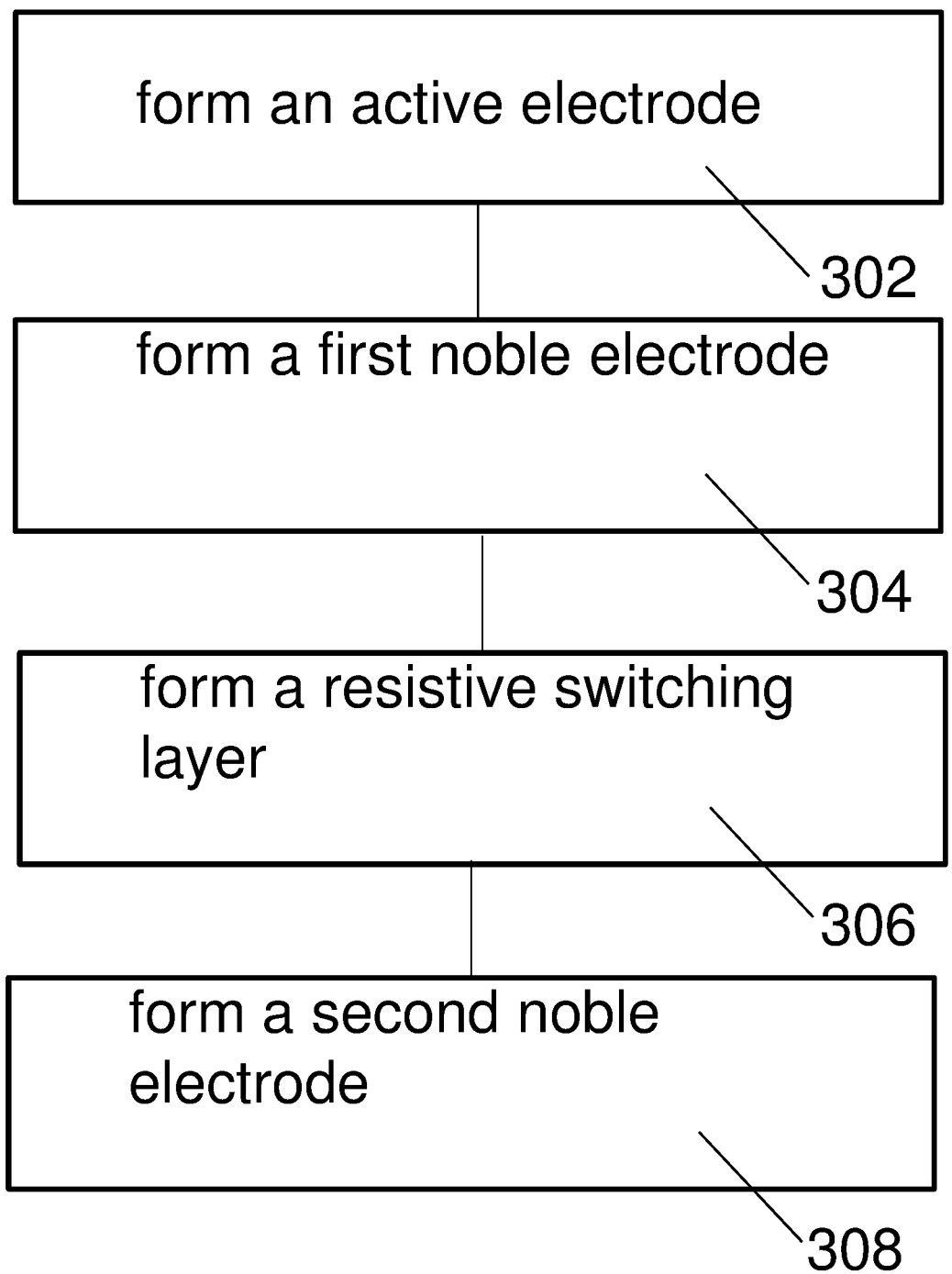
FIG. 3 is a general illustration of a method of forming a memory cell according to various embodiments.

FIG. 3 is a general illustration of a method of forming a memory cell according to various embodiments. The method may include, in 302, forming an active electrode including an active electrode material. The method may also include, in 304, forming a first noble electrode in contact with the active electrode, the first noble electrode being a patterned electrode including a noble electrode material. The method may further include, in 306, forming a resistive switching layer in contact with the active electrode and the first noble electrode. The method may also include, in 308, forming a second noble electrode including a noble electrode material, the second noble electrode in contact with the resistive switching layer.

In other words, forming the memory cell may include fabricating an active electrode, fabricating a patterned first noble electrode, fabricating the resistive switching layer, and fabricating the second noble electrode.

For avoidance of doubt, FIG. 3 is not intended to be in sequence. For instance, in various embodiments, step 302 may occur first before step 304, followed by step 306 and step 308. The active electrode may be formed before the first noble electrode is formed on the active electrode. The resistive switching layer may be formed in contact with the active electrode and the first noble electrode after forming the active electrode and the first noble electrode. The second noble electrode may be formed on the resistive switching layer after the resistive switching layer is formed.

In various other embodiments, step 308 may occur before step 306, followed by step 304 and step 302.

In various embodiments, the patterned first noble electrode may include a plurality of nanostructures. The plurality of nanostructures may be formed by any one deposition process selected from a group consisting of pulsed laser deposition (PLD), chemical vapor deposition (CVD), sputtering, and wet-chemical assembly. The plurality of nanostructures formed may be of a random arrangement. The deposition process may have a high deposition rate to form separated or isolated nanostructures in a single step. For instance, at high deposition rate of 0.05 nm/s or higher, the deposited material by PLD may agglomerate to form separated or isolated nanostructures.

In various embodiments, the plurality of nanostructures may be formed by coating a resist material on the active electrode, patterning the resist material, depositing the noble electrode material (included in the first noble electrode), and removing the resist material. The plurality of nanostructures may be arranged in an array, e.g. a periodic or an aperiodic array. In various embodiments, the plurality of nanostructures may be formed by depositing a noble electrode material (included in the first noble electrode) on the active electrode, coating a resist material on the noble electrode material, patterning the resist material, etching the noble electrode material, and removing the resist material. The plurality of nanostructures may be arranged in an array, e.g. a periodic or an aperiodic array.

In various embodiments, the resistive switching layer may extend between neighboring nanostructures of the plurality of nanostructures to be in contact with the active electrode.

In various embodiments, the second noble electrode may be formed by any one deposition process selected from a group consisting of atomic layer deposition (ALD), chemical vapor deposition (CVD), pulsed laser deposition (PLD), and sputtering. The deposition process may have a low deposition rate to form a continuous electrode. For instance, at low deposition rate of 0.01 nm/s or lower, the deposited material by PLD may have sufficient time to move or rearrange to form a continuous structure.

Figure 4:
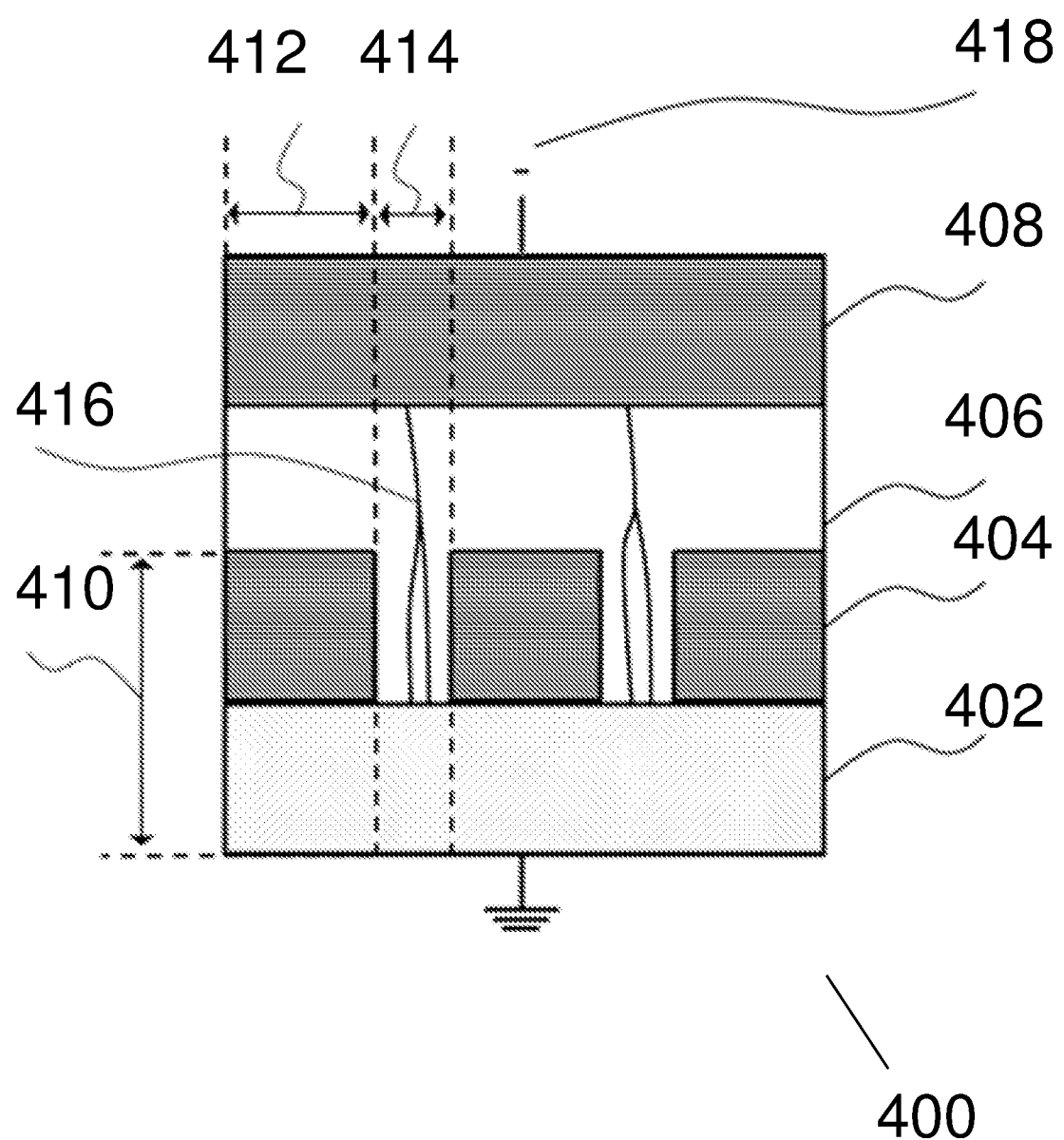
FIG. 4 shows a schematic of a memory cell according to various embodiments.

FIG. 4 shows a schematic of a memory cell 400 according to various embodiments. In order to improve clarity and avoid clutter, not all like features have been labelled. The memory cell 400 may include an active electrode 402 including an active electrode material. The memory cell 400 may also include a first noble electrode 404 in contact with the active electrode 402, the first noble electrode 404 being a patterned electrode including a noble electrode material. The memory cell 400 may further include a resistive switching layer 406 in contact with the active electrode 402 and the first noble electrode 404. The memory cell 400 may additionally include a second noble electrode 408 including a noble electrode material, the second noble electrode 408 in contact with the resistive switching layer 406.

The second noble electrode 408 may be a continuous electrode forming a continuous interface with the resistive switching layer 406. The patterned first noble electrode 404 and the continuous active electrode 402 may form a noble-active hybrid electrode structure 410. In other words, the noble-active hybrid electrode structure 410 may include the patterned first noble electrode 404 and the underlying continuous active electrode 402. The patterned first noble electrode 404 may include a plurality of nanostructures, such as nanocolumns or nanoparticles. The sizes of the nanostructures may or may not be the same.

The resistive switching layer 406 may fill the gaps between the noble nanostructures (e.g. nanocolumns/nanoparticles), so that both the upper nanostructures 404 and the underlying active layer 402 are in direct contact with the resistive switching layer 406, forming both active and noble interfaces simultaneously. Thus, the symmetric-asymmetric architecture in FIG. 4 may include both noble-noble symmetric 412 and noble-active asymmetric 414 architectures. The cell 400 may be configured so that one or more conduction paths 416 are formed in the resistive switching layer 406 when a voltage 418 of a first polarity is applied, and the one or more conduction paths 416 are disrupted when a voltage 418 of a second polarity opposite the first polarity is applied.

The noble-noble symmetric architecture or arrangement/portion 412 may keep resistance high and may block current in the region, reducing the effective area of current flow and the magnitude of the operating current. The noble-active asymmetric architecture or arrangement/portion 414 may carry confined and concentrated current flow, and may be the conducting channel(s) responsible for the resistive switching behavior. The constricted conduction paths may form and rupture stably and predictably within the noble-active asymmetric architecture or arrangement/portion 414, leading to enhanced switching uniformity.

Figure 5:
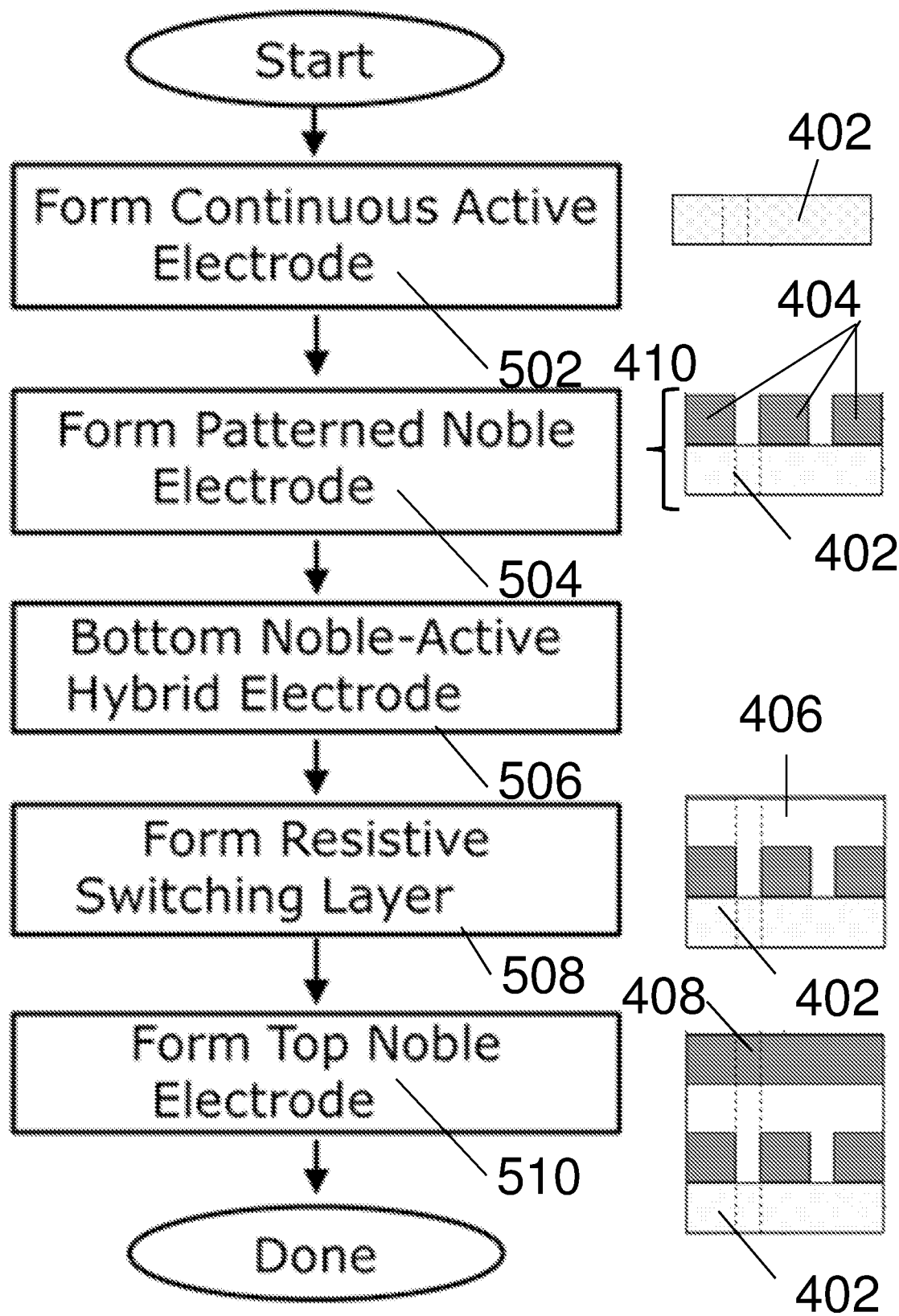
FIG. 5 shows (left) a process flow chart of a method of forming a symmetric-asymmetric hybrid resistive random access memory (RRAM) cell according to various embodiments and (right) the features formed corresponding to the features of the cell shown in FIG. 4 according to various embodiments.

FIG. 5 shows (left) a process flow chart of a method of forming a symmetric-asymmetric hybrid resistive random access memory (RRAM) cell according to various embodiments and (right) the features formed corresponding to the features of the cell shown in FIG. 4 according to various embodiments. In addition to the steps shown in FIG. 5, various embodiments may include additional steps. In order to improve clarity and avoid clutter, not all like features have been labelled.

The processes may generally start from the formation of bottom noble-active hybrid electrode structure 410. The formation of the bottom noble-active hybrid electrode structure 410 may first involve forming a continuous layer of active electrode 402 (step 502) followed by disposing an overlying layer of patterned/assembled nanostructured noble electrode 404 (step 504) using, for example, pulsed laser deposition (PLD), chemical vapor deposition (CVD) assembly, sputtering processes, wet-chemical assembly and so on, thereby forming the bottom noble-active hybrid electrode structure 410 (step 506). In various embodiments, the noble electrode 404 may be patterned using lithography and etching processes. In various other embodiments, forming the electrode 404 may including using PLD, and the deposition rate may be controlled to be high (~0.05 nm/s) to form the uniformly separated nanocolumns by a one-step process. Various embodiments may involve assembling noble nanocolumns 404 (including iron oxide or $Fe_3O_4$) on the continuous active layer 402 (including tantalum or Ta) to form the noble active-hybrid electrode structure 410.

A resistive switching layer 406 may be further disposed on top of the noble-active hybrid electrode structure (step 508), which is in direct contact with both the bottom noble electrode 40 and the active electrode 402 of the bottom noble-active hybrid electrode structure 410. Various deposition techniques may be applied to form the resistive switching layer 406, including atomic layer deposition (ALD), CVD, PLD, sputtering, and so on. Finally, a top continuous noble electrode 408 (step 510) may be disposed by various possible techniques, such as ALD, CVD, PLD, sputtering, and so on. For instance, in order to keep the top noble electrode 408 continuous, the deposition rate may be controlled to be low (~0.01 nm/s) using PLD. All electrode and resistive switching materials used may be complementary metal oxide semiconductor (CMOS)-compatible and may be readily patterned by etching processes, which may enable the implementation of the RRAM unit in practical devices or three dimensional (3D) structures.

Figure 6A:
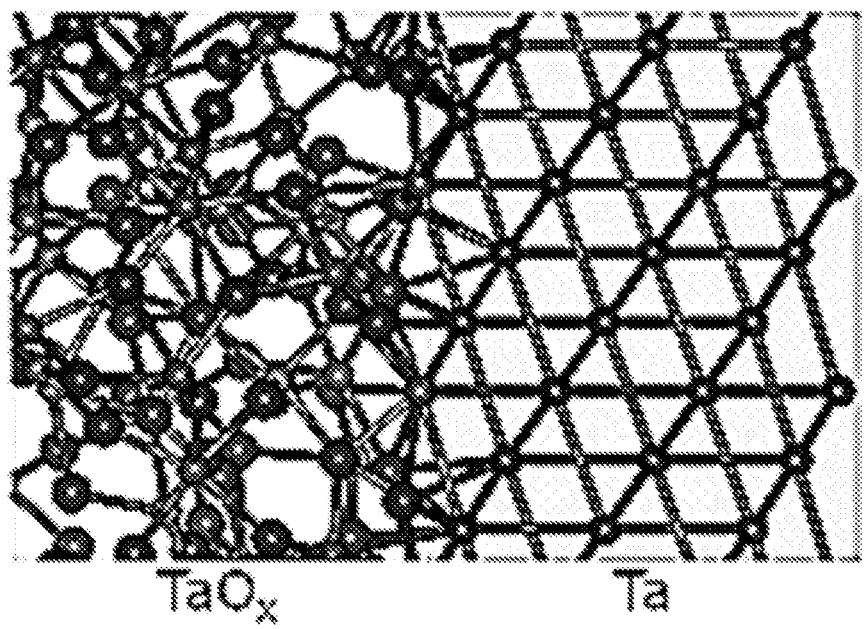
FIG. 6A shows a schematic illustrating the atomic structure around an easily oxidizable active interface formed between a resistive switching layer tantalum oxide ($TaO_x$) and an active electrode material tantalum metal (Ta) of a memory cell according to various embodiments.
Figure 6B:
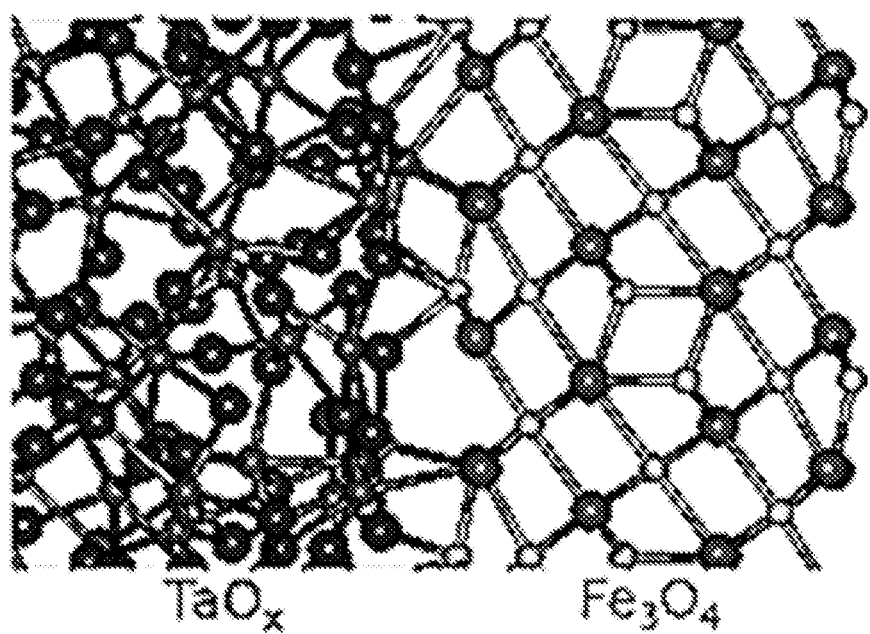
FIG. 6B shows a schematic illustrating the atomic structure around an oxidation-resistive noble interface formed between a resistive switching layer tantalum oxide ($TaO_x$) and a noble electrode material iron oxide ($Fe_3O_4$) of a memory cell according to various embodiments.
Figure 6C:
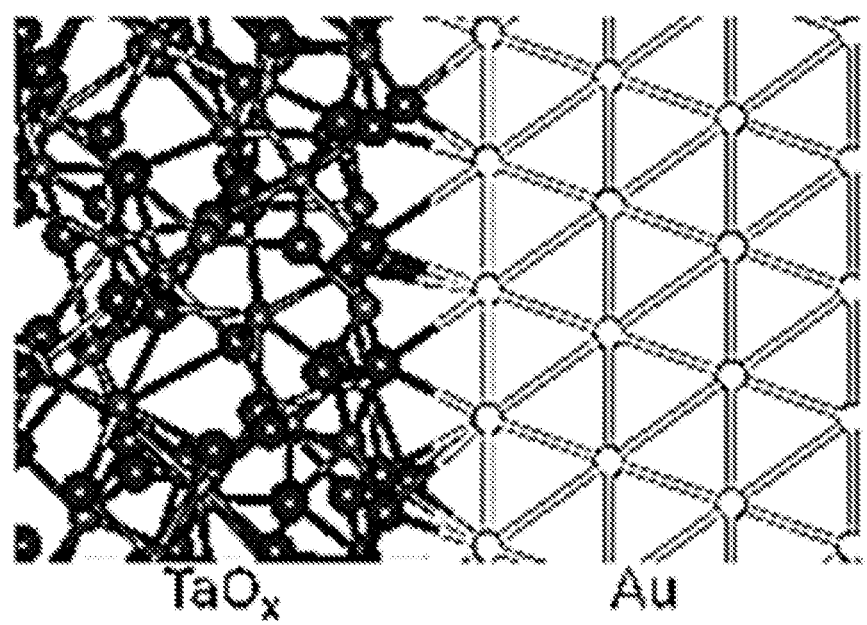
FIG. 6C shows a schematic illustrating the atomic structure around an oxidation-resistive noble interface formed between a resistive switching layer tantalum oxide ($TaO_x$) and a noble electrode material gold metal (Au) of a memory cell according to various embodiments.

FIG. 6A shows a schematic illustrating the atomic structure around an easily oxidizable active interface formed between a resistive switching material tantalum oxide ($TaO_x$) and an active electrode material tantalum metal (Ta) of a memory cell according to various embodiments. FIG. 6B shows a schematic illustrating the atomic structure around an oxidation-resistive noble interface formed between a resistive switching material tantalum oxide ($TaO_x$) and a noble electrode material iron oxide ($Fe_3O_4$) of a memory cell according to various embodiments. FIG. 6C shows a schematic illustrating the atomic structure around an oxidation-resistive noble interface formed between a resistive switching material tantalum oxide ($TaO_x$) and a noble electrode material gold metal (Au) of a memory cell according to various embodiments.

Figure 6D:
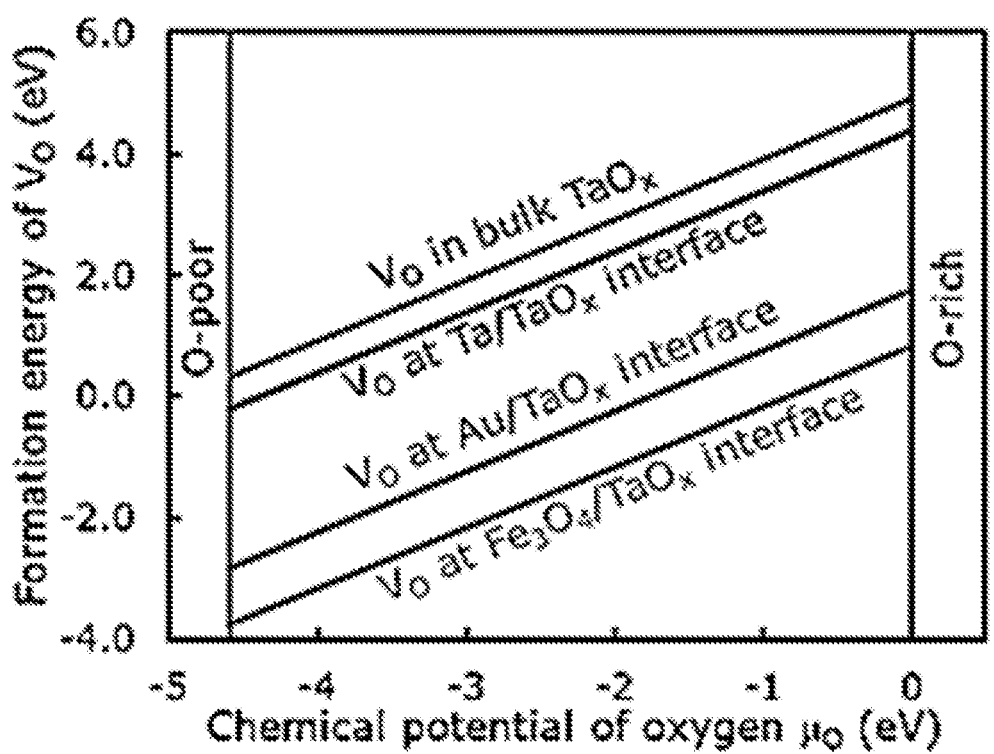
FIG. 6D is a plot of formation energy $V_O$ (in electron volts or eV) as a function of chemical potential of oxygen $\mu_O$ (in electron volts or eV) showing the resistance of oxidation of the various interfaces of the memory cell according to various embodiments shown in FIGS. 6A-C.

FIG. 6D is a plot of formation energy $V_O$ (in electron volts or eV) as a function of chemical potential of oxygen $\mu_O$ (in electron volts or eV) showing the resistance of oxidation of the various interfaces of the memory cell according to various embodiments shown in FIGS. 6A-C. FIG. 6D shows that the active interface Ta/$TaO_x$ may be easily oxidizable, while the noble interfaces ($Fe_3O_4$/$TaO_x$ and Au/$TaO_x$) may be oxidation-resistive. In various embodiments, the formation energy of an interface between an active electrode and the resistive switching layer may be of a value above 2.5 eV at a chemical potential of oxygen of 0 eV, while the formation of an interface between a noble electrode and the resistive switching layer may be of a value below 2.5 eV at a chemical potential of oxygen of 0 eV.

Figure 6E:
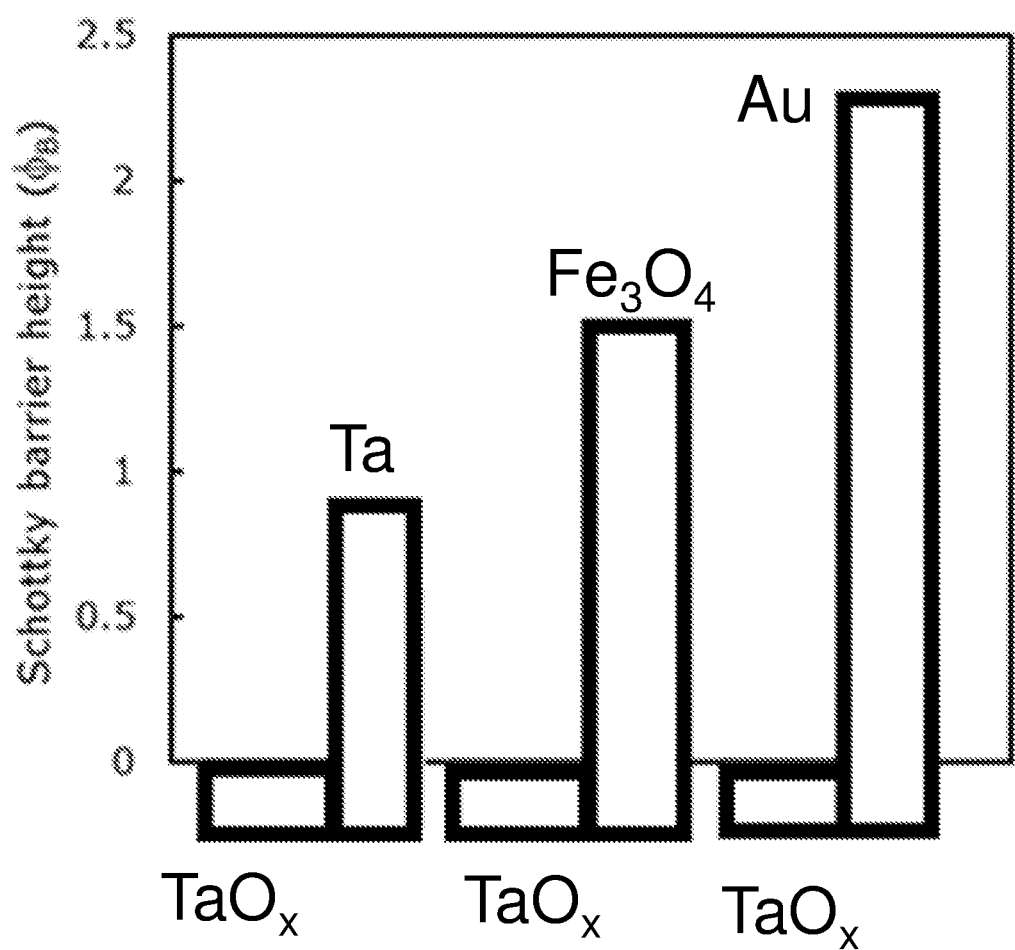
FIG. 6E shows the Schottky barrier heights formed by various interfaces of the memory cell according to various embodiments shown in FIGS. 6A-C.

FIG. 6E shows the Schottky barrier heights formed by various interfaces of the memory cell according to various embodiments shown in FIGS. 6A-C. Ta/$TaO_x$ may have a low interfacial Schottky barrier height of about 0.9 eV, while $Fe_3O_4$/$TaO_x$ may have a high interfacial Schottky barrier height of about 1.5 eV. Au/$TaO_x$ may have an even higher interfacial Schottky barrier height of about 2.3 eV.

Figure 6F:
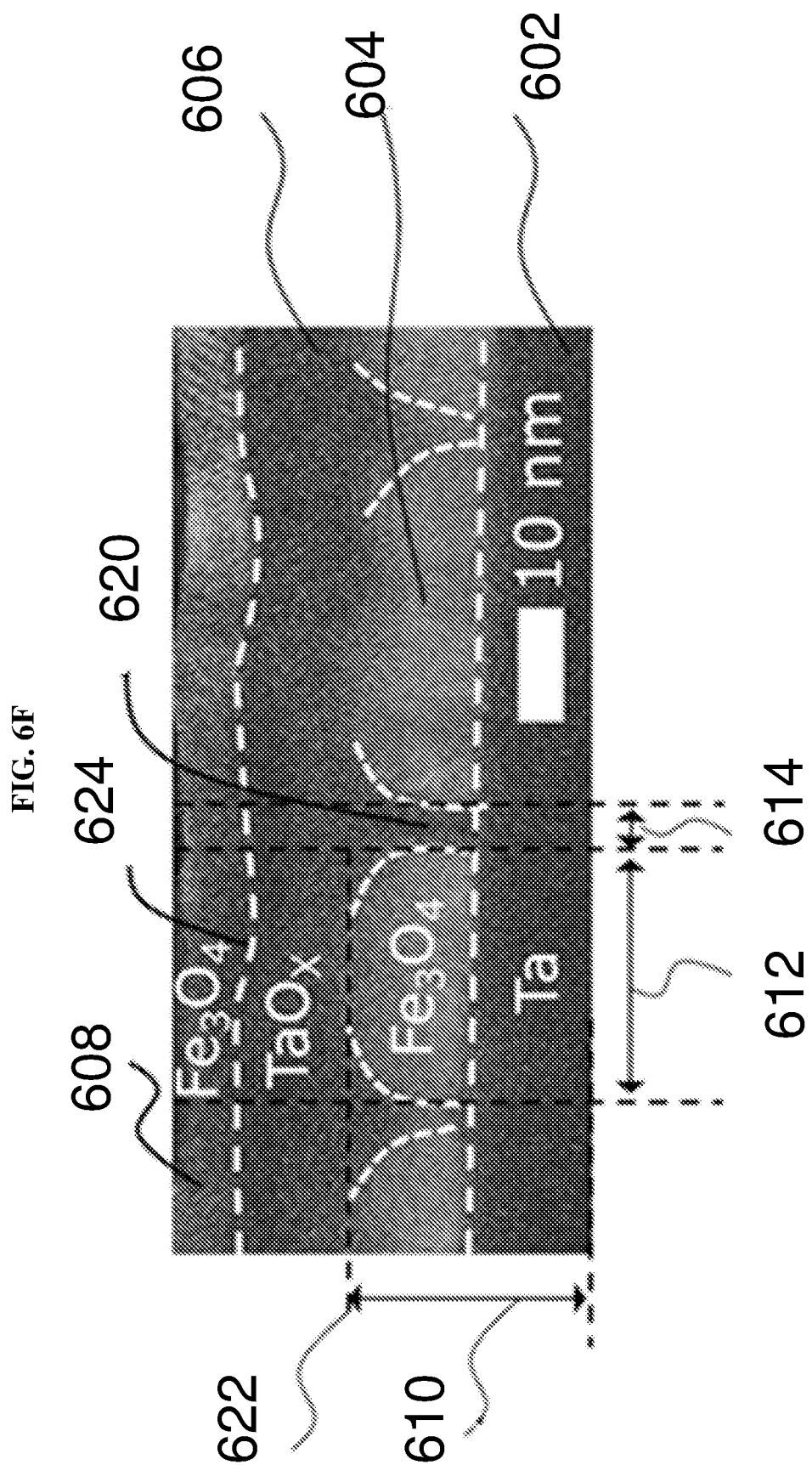
FIG. 6F shows a cross-sectional transmission electron microscopy (TEM) image of a symmetric-asymmetric resistive random access memory cell according to various embodiments.

FIG. 6F shows a cross-sectional transmission electron microscopy (TEM) image of a symmetric-asymmetric resistive random access memory cell according to various embodiments. The memory cell may include a resistive switching layer 606 of tantalum oxide ($TaO_x$) having a bilayer column assembled hybrid electrode structure 610 of iron oxide/tantalum metal ($Fe_3O_4$/Ta).

A continuous Ta layer 602 may be disposed on a $SiO_2$ silicon substrate by sputtering, using a power of about 50 W at a pressure of about $3\times10^{-3}$ Torr under an argon (Ar) flow rate of 48 sccm at room temperature.

A layer of assembled $Fe_3O_4$ nanograins 604 may be further disposed on the active Ta layer 602 by PLD at about 300° C. and a repetition rate of 10 Hz under an oxygen partial pressure of $10^{-6}$ Torr. The lateral size and height of the $Fe_3O_4$ nanograins may be about 20 nm and about 10 nm respectively. The size of the gaps 620 between the nanograins 604 may be around 5 nm. The Ta layer 602 and $Fe_3O_4$ nanograins 604 may form a bilayer $Fe_3O_4$—Ta noble-active hybrid electrode structure 610. PLD may be used to deposit a resistive switching layer 606 of $TaO_x$ on top of the hybrid electrode structure 610 at room temperature under oxygen partial pressure of $10^{-2}$ Torr. The $TaO_x$ layer 606 may fully contact with the bottom bilayer $Fe_3O_4$—Ta noble-active hybrid electrode structure 610 and may fully fill the gaps between the $Fe_3O_4$ nanograins 604.

The upper surface 624 of the $TaO_x$ layer 606 may be about 10 nm higher than the top surface 622 of the $Fe_3O_4$ nanograins 604. After that, PLD may be used to further deposit a continuous $Fe_3O_4$ layer 608 as the top noble electrode on the $TaO_x$ resistive switching layer 606 at about 300° C. and a repetition rate of 2 Hz under an oxygen partial pressure of about $10^{-6}$ Torr. The symmetric-asymmetric architecture may include both noble-noble symmetric ($Fe_3O_4$/$TaO_x$/$Fe_3O_4$) 612 and noble-active asymmetric ($Fe_3O_4$/$TaO_x$/Ta) 614 architectures.

The roles of the noble-noble symmetric ($Fe_3O_4$/$TaO_x$/$Fe_3O_4$ or Au/$TaO_x$/$Fe_3O_4$) and noble-active asymmetric ($Fe_3O_4$/$TaO_x$/Ta) architectures in the resistive switching process may be demonstrated by systematic current-voltage (IV) characterizations.

Figure 7A:
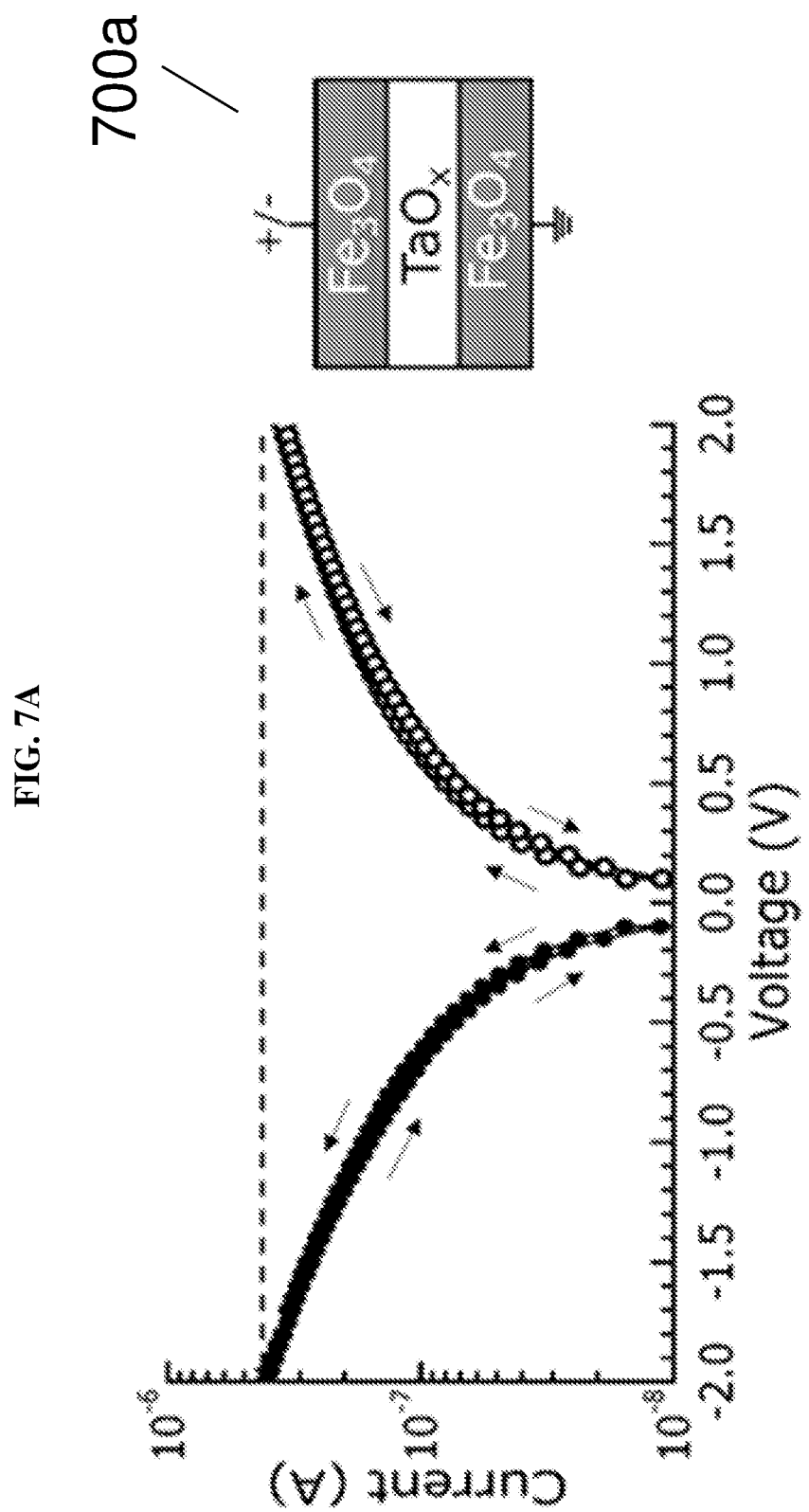
FIG. 7A shows (right) a schematic of a noble-noble symmetric cell (iron oxide ($Fe_3O_4$)/tantalum oxide ($TaO_x$)/iron oxide ($Fe_3O_4$)); and (left) a plot of current (in amperes or A) as a function of voltage (in volts or V) illustrating the current-voltage (IV) characteristics of the noble-noble symmetric cell shown on the left.

FIG. 7A shows (right) a schematic of a noble-noble symmetric cell 700a (iron oxide ($Fe_3O_4$)/tantalum oxide ($TaO_x$)/iron oxide ($Fe_3O_4$)); and (left) a plot of current (in amperes or A) as a function of voltage (in volts or V) illustrating the current-voltage (IV) characteristics of the noble-noble symmetric cell 700a shown on the left. As shown on the right, the symmetric cell 700a may include a tantalum oxide ($TaO_x$) resistive switching layer sandwiched by two noble electrodes of iron oxide ($Fe_3O_4$). There is no significant change in the resistance when applying voltages of the positive polarity or the negative polarity, thus indicating that there may be no conduction paths formed in the noble-noble symmetric cell whether either positive or negative voltages are applied. The noble-noble symmetric structure 700a may maintain a high resistance of about $5\times10^6$ Ohm with a small leakage current below $4\times10^{-7}$ A, and may thus work as an effective current blocker.

Figure 7B:
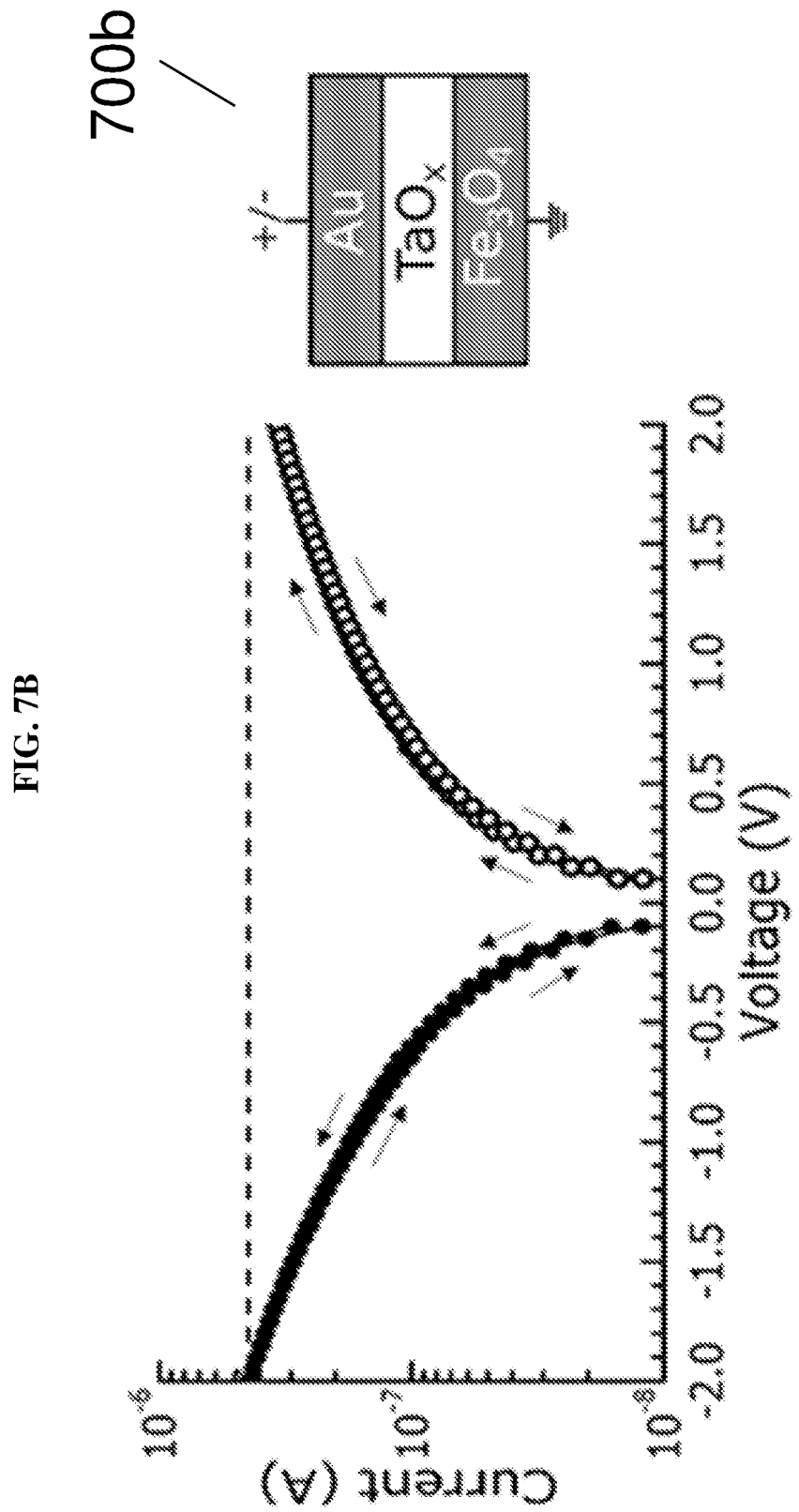
FIG. 7B shows (right) a schematic of a noble-noble symmetric cell (gold (Au)/tantalum oxide ($TaO_x$)/iron oxide ($Fe_3O_4$)); and (left) a plot of current (in amperes or A) as a function of voltage (in volts or V) illustrating the current-voltage (IV) characteristics of the noble-noble symmetric cell shown on the left.

FIG. 7B shows (right) a schematic of a noble-noble symmetric cell 700b (gold (Au)/tantalum oxide ($TaO_x$)/iron oxide ($Fe_3O_4$)); and (left) a plot of current (in amperes or A) as a function of voltage (in volts or V) illustrating the current-voltage (IV) characteristics of the noble-noble symmetric cell 700b shown on the left. There is also no significant change in the resistance when applying voltages of the positive polarity or the negative polarity. FIG. 7B may affirm that the noble-noble symmetric architecture 700a, 700b is free of conduction paths and may block current, regardless of whether the noble electrodes are of the same or different noble materials.

Figure 7C:
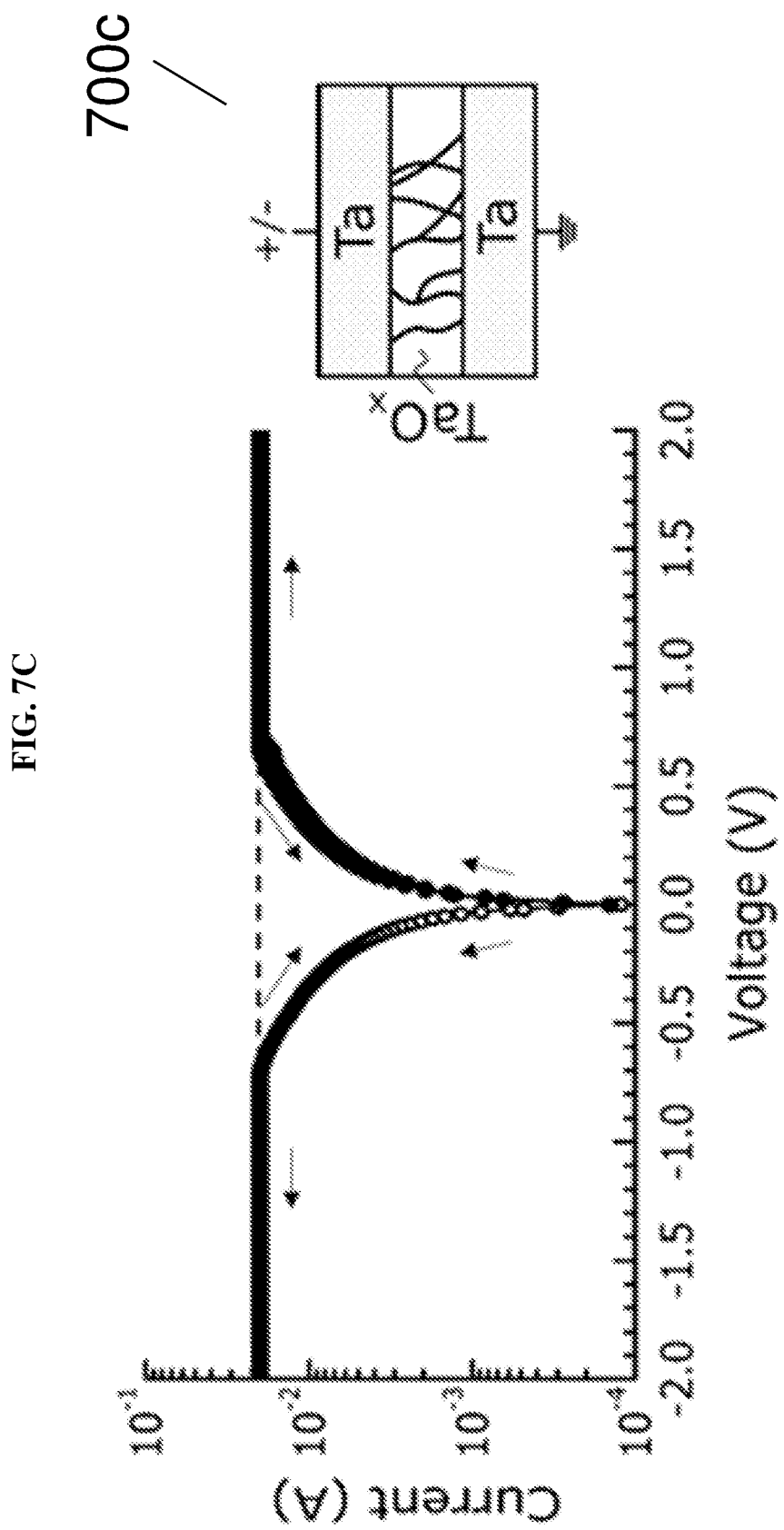
FIG. 7C shows (right) a schematic of an active-active symmetric cell (tantalum metal (Ta)/tantalum oxide ($TaO_x$)/tantalum metal (Ta)); and (left) a plot of current (in amperes or A) as a function of voltage (in volts or V) illustrating the current-voltage (IV) characteristics of the active-active symmetric cell shown on the left.

FIG. 7C shows (right) a schematic of an active-active symmetric cell 700c (tantalum metal (Ta)/tantalum oxide ($TaO_x$)/tantalum metal (Ta)); and (left) a plot of current (in amperes or A) as a function of voltage (in volts or V) illustrating the current-voltage (IV) characteristics of the active-active symmetric cell 700c shown on the left. The cell 700c may include a tantalum oxide ($TaO_x$) resistive switching layer sandwiched by two active electrodes of tantalum metal. The current may reach a compliance current of $2\times10^{-2}$ A when applying a small voltage of about ±0.7 V of either a positive polarity or a negative polarity. Thus, the active-active symmetric structure 700c may not be switched to the high resistance state (HRS). The structure 700c may be permanently shorted with low resistance of only about 35 ohms and should be avoided in RRAM cell structure.

Figure 8A:
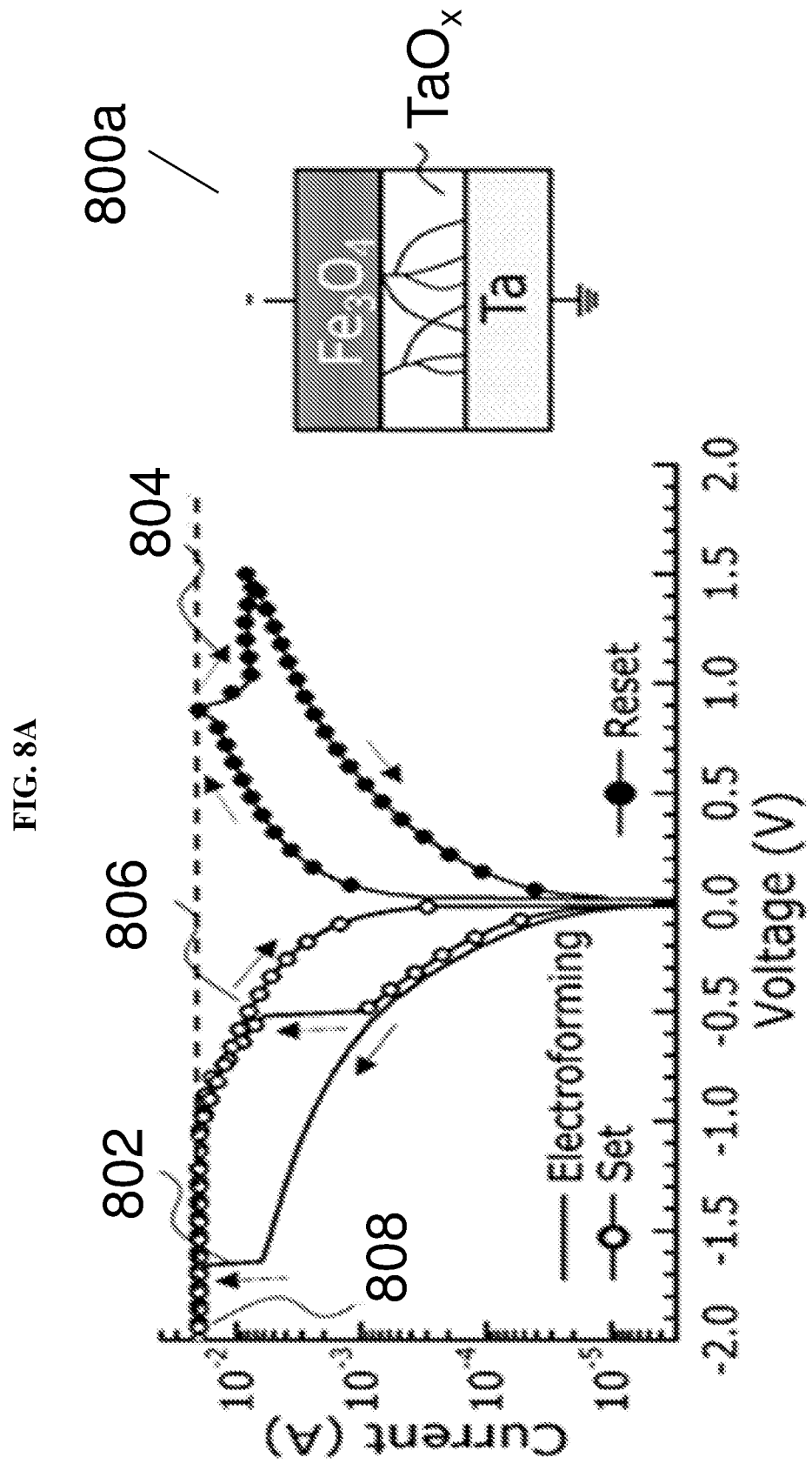
FIG. 8A shows (right) a schematic of a noble-active asymmetric cell (iron oxide ($Fe_3O_4$)/tantalum oxide ($TaO_x$)/tantalum metal (Ta)); and (left) a plot of current (in amperes or A) as a function of voltage (in volts or V) illustrating the current-voltage (IV) characteristics of the noble-active asymmetric cell 800a shown on the left.

FIG. 8A shows (right) a schematic of a noble-active asymmetric cell 800a (iron oxide ($Fe_3O_4$)/tantalum oxide ($TaO_x$)/tantalum metal (Ta)); and (left) a plot of current (in amperes or A) as a function of voltage (in volts or V) illustrating the current-voltage (IV) characteristics of the noble-active asymmetric cell 800a shown on the left. The cell may include a resistive switching layer of $TaO_x$ sandwiched by a top noble electrode of $Fe_3O_4$ and a bottom active electrode of Ta. When applying a negative voltage of −1.6 V on the top $Fe_3O_4$ noble electrode, the cell 800a may switch from the initial HRS to a LRS (known as electroforming process 802). The cell 800a may be subsequently switched back to the HRS by a reset process 804 and then to LRS again by a set process 806. Random conduction paths may form in the noble-active asymmetric ($Fe_3O_4$/$TaO_x$/Ta) architecture 800a during the electroforming process 802 and the set process 806, and may rupture in the reset process 804. There may be no restriction for forming the conduction paths in the resistive switching layer of $TaO_x$, and the conduction paths may be random, divergent or even cross-linked, leading to a high operating set/reset current 808 of about $2 \times 10^{-2}$ A and non-uniform switching process.

Figure 8B:
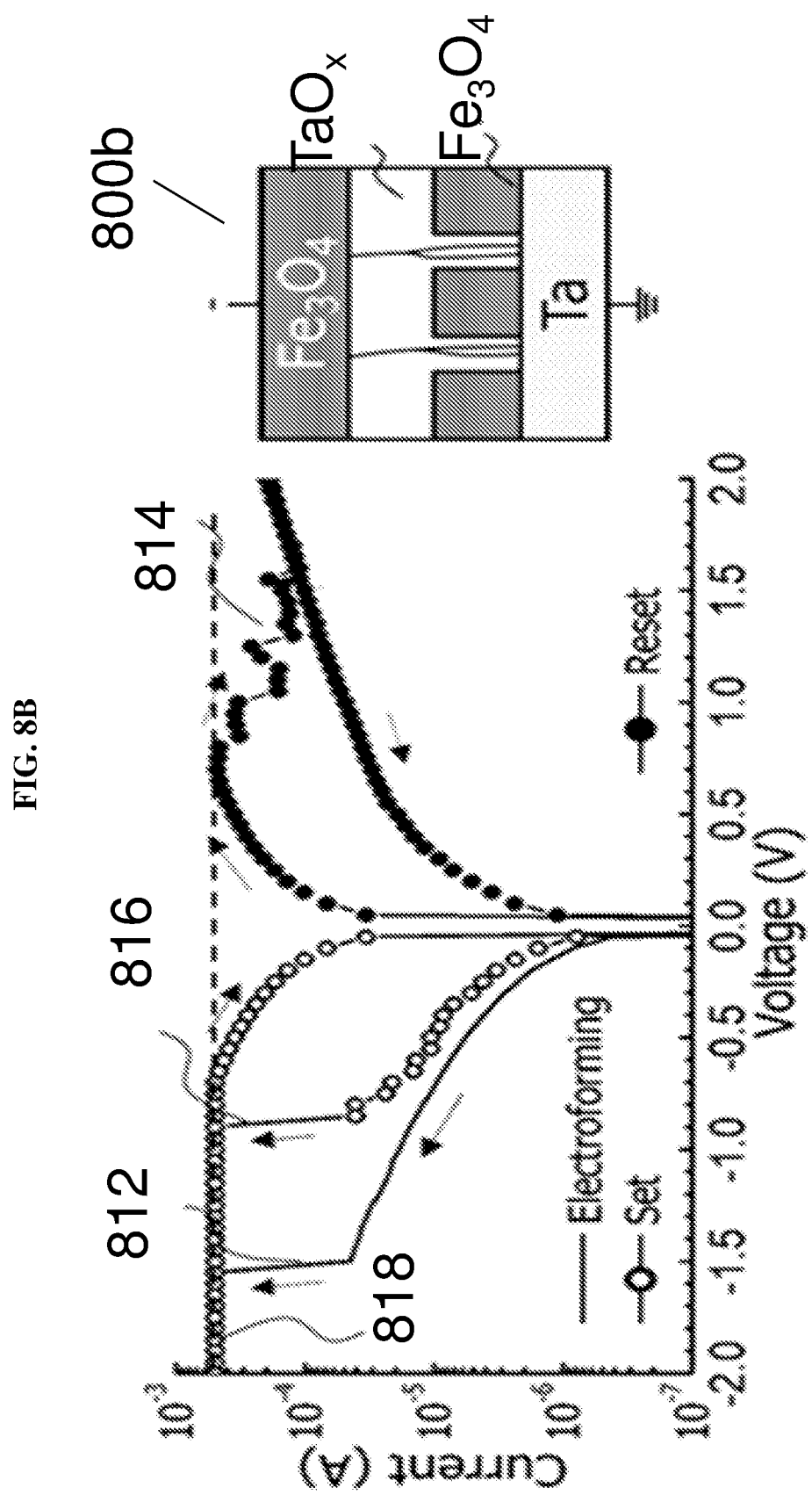
FIG. 8B shows (right) a schematic of a symmetric-asymmetric cell (iron oxide ($Fe_3O_4$)/tantalum oxide ($TaO_x$)/iron oxide-tantalum metal ($Fe_3O_4$—Ta)) according to various embodiments; and (left) a plot of current (in amperes or A) as a function of voltage (in volts or V) illustrating the current-voltage (IV) characteristics of the symmetric-asymmetric cell according to various embodiments shown on the left.

FIG. 8B shows (right) a schematic of a symmetric-asymmetric cell 800b (iron oxide ($Fe_3O_4$)/tantalum oxide ($TaO_x$)/iron oxide-tantalum metal ($Fe_3O_4$—Ta)) according to various embodiments; and (left) a plot of current (in amperes or A) as a function of voltage (in volts or V) illustrating the current-voltage (IV) characteristics of the symmetric-asymmetric cell 800b according to various embodiments shown on the left. The cell 800b may include a resistive switching layer of $TaO_x$, sandwiched by a continuous top electrode of iron oxide ($Fe_3O_4$) and a bottom bilayer $Fe_3O_4$—Ta noble-active hybrid electrode structure. The structure 800b may include both the noble-noble symmetric architecture ($Fe_3O_4$/$TaO_x$/$Fe_3O_4$) and the noble-active asymmetric ($Fe_3O_4$/$TaO_x$/Ta) architecture in a single symmetric-asymmetric RRAM cell 800b ($Fe_3O_4$/$TaO_x$/$Fe_3O_4$—Ta).

When applying a negative voltage of −1.6 V on the top $Fe_3O_4$ noble electrode, the cell 800b may switch from initial HRS to LRS (known as electroforming process 812). The cell 800b may subsequently be switched back to HRS by a reset process 814 and then to LRS again by a set process 816. The noble-noble symmetric electrode architecture ($Fe_3O_4$/$TaO_x$/$Fe_3O_4$) may work as current blockers that confine and concentrate current into the noble-active asymmetric ($Fe_3O_4$/$TaO_x$/Ta) architectures. Constricted conduction paths may form in the noble-active asymmetric architecture ($Fe_3O_4$/$TaO_x$/Ta) in the electroforming process 812 and the set process 816, and may rupture in the reset process 814. Thus, the noble-active asymmetric architecture ($Fe_3O_4$/$TaO_x$/Ta) may work as conducting channels to constrict the formation of conduction paths. The localized and confined conduction paths may lead to a low operating set/reset current 818 of about $5 \times 10^{-4}$ A and good switching uniformity. Comparing to the conventional individual asymmetric RRAM cell of the same size in FIG. 8A, the symmetric-asymmetric RRAM cell according to various embodiments may achieve an about 40 times reduction in operation current, and may hence reduce the power consumption by about 40 times for the same operating voltage.

Figure 8C:
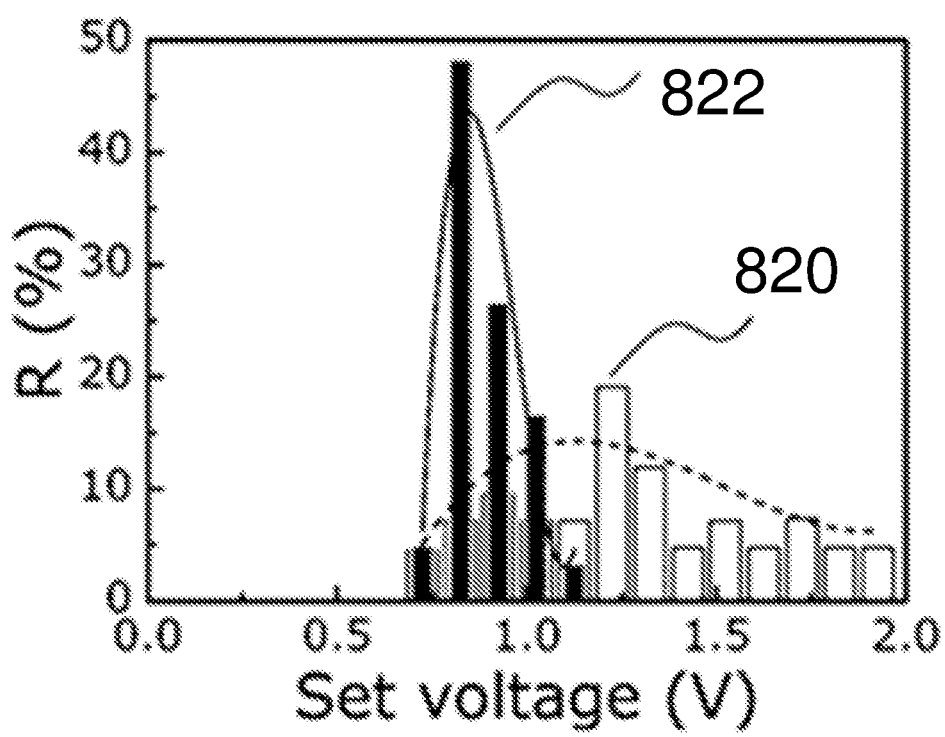
FIG. 8C is a plot of percentage ratio R (in percent or %) as a function of set voltage (in volts or V) illustrating the probability distribution of set voltages of a conventional noble-active asymmetric resistive random access memory cell (as shown in FIG. 8A) as well as the probability distribution of set voltages of an symmetric-asymmetric resistive random access memory cell (as shown in FIG. 8B) according to various embodiments.

FIG. 8C is a plot of percentage ratio R (in percent or %) as a function of set voltage (in volts or V) illustrating the probability distribution of set voltages of a conventional noble-active asymmetric resistive random access memory cell (as shown in FIG. 8A) as well as the probability distribution of set voltages of an symmetric-asymmetric resistive random access memory cell (as shown in FIG. 8B) according to various embodiments. The set voltages of the conventional noble-active asymmetric $Fe_3O_4$/$TaO_x$/Ta cell may fluctuate largely in a wide range 820 between about 0.7 V and about 2.0 V. The low switching uniformity may be ascribed to the random and unstable formation of conduction paths. In contrast, the set voltages of the assembled symmetric-asymmetric ($Fe_3O_4$/$TaO_x$/$Fe_3O_4$—Ta) cell according to various embodiments fall within a narrow range 822 between about 0.7 V and about 1.2 V. The improved switching uniformity and stability may be because the formation of conduction paths is localized and confined within well-defined regions.

Figure 8D:
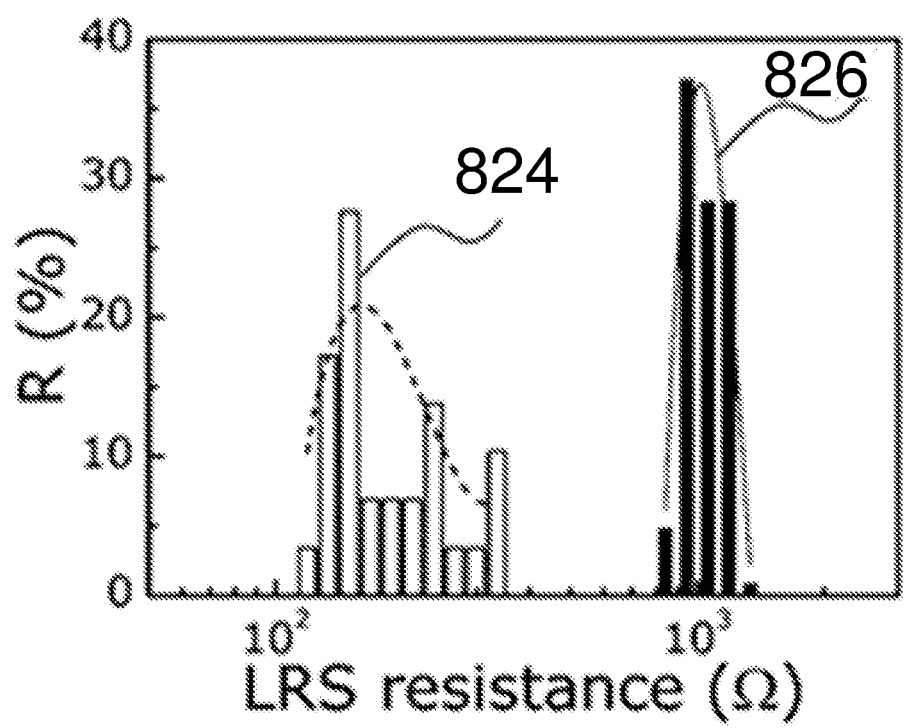
FIG. 8D is a plot of probability distribution (in percent or %) as a function of resistance (in ohms or Ω) illustrating the probability distribution of low resistance state (LRS) resistances of a conventional noble-active asymmetric resistive random access memory cell (as shown in FIG. 8A) as well as the probability distribution of low resistance state (LRS) resistances of an symmetric-asymmetric resistive random access memory cell (as shown in FIG. 8B) according to various embodiments.

FIG. 8D is a plot of probability distribution (in percent or %) as a function of resistance (in ohms or Ω) illustrating the probability distribution of low resistance state (LRS) resistances of a conventional noble-active asymmetric resistive random access memory cell (as shown in FIG. 8A) as well as the probability distribution of low resistance state (LRS) resistances of an symmetric-asymmetric resistive random access memory cell (as shown in FIG. 8B) according to various embodiments. The LRS resistances of the conventional noble-active asymmetric $Fe_3O_4$/$TaO_x$/Ta cell may have a wide probability distribution range 824. It may be because the conduction paths may form randomly at different positions or in different shapes for each switching cycle, leading to the fluctuation of LRS resistances, leading to switching non-uniformity. In contrast, the LRS resistances of the assembled symmetric-asymmetric ($Fe_3O_4$/$TaO_x$/$Fe_3O_4$—Ta) cell according to various embodiments may possess a narrow probability distribution range 826, because the conduction paths may only form in well-defined conducting channels. The localized and confined conduction paths may form and rupture stably and predictably, leading to good switching uniformity.

Various embodiments may provide a unique strategy to confine conducting paths in RRAM cell. Various embodiments may include a noble-active hybrid electrode structure, which combines active nanostructured electrode materials and noble continuous electrode materials. Experts in the field may typically choose either noble material or active electrode material in devices. In contrast, various embodiments may include both noble and active materials in one electrode structure.

The hybrid noble-active electrode structure according to various embodiments may lead to the formation of a hybrid symmetric-asymmetric RRAM cell. Various embodiments may implement the RRAM cell by rate-controlling deposition. The symmetric noble-noble electrode architecture may block current and confine or concentrate conducting paths within or into the asymmetric noble-active electrode architecture. The noble-active asymmetric architecture may work as conducting channels to constrict the formation of conduction paths. The RRAM with the unique noble-active hybrid electrode structure may possess improved switching uniformity and may reduce power consumption by up to about 40 times.

Various embodiments may physically confine conduction paths within well-defined conductive regions. The well-defined conductive regions may be separated by current blockers, which may significantly reduce the effective area of current flow, and which may suppress operating current density. The confinement of conduction paths within the well-defined conductive regions may significantly enhance the resistive switching uniformity.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A memory cell comprising:
an active electrode consisting of an active electrode material;
a first noble electrode in contact with the active electrode, the first noble electrode being a patterned electrode comprising a noble electrode material;
a resistive switching layer in contact with the active electrode and the first noble electrode; and
a second noble electrode comprising a noble electrode material, the second noble electrode in contact with the resistive switching layer;
wherein the first noble electrode comprises a grid comprising a plurality of openings;
wherein the first noble electrode is configured to block current from flowing through;
wherein portions of the resistive switching layer in contact with the active electrode, and extending within the plurality of openings of the grid form conduction channels such that one or more conduction paths are formed in the conduction channels when a potential difference is applied along one direction across the resistive switching layer;
wherein the active electrode material is selected from a group consisting of titanium (Ti), nickel (Ni), tantalum (Ta), hafnium (Hf), and aluminum (Al) such that the active electrode and the resistive switching layer form a Schottky barrier of 1.1 eV or below; and
wherein the first noble electrode and the resistive switching layer form a Schottky barrier of 1.2 eV or above.

2. The memory cell according to claim 1, wherein the noble electrode material of the first noble electrode is same as the noble electrode material of the second noble electrode.

3. The memory cell according to claim 1, wherein the noble electrode material of the first noble electrode is different from the noble electrode material of the second noble electrode.

4. The memory cell according to claim 1, wherein the noble electrode material of the first noble electrode and the noble material electrode material of the second noble electrode are electrically conductive materials, and are selected from a group consisting of noble metals, conductive oxides, and conductive nitrides.

5. The memory cell according to claim 1, wherein the active electrode material is an electrically conductive material, and is an active metal or an active metal alloy.

6. The memory cell according to claim 1, wherein the resistive switching layer comprises an oxide material.

7. The memory cell according to claim 6, wherein the oxide material is a transition metal oxide or a perovskite oxide.

8. A method of forming a memory cell, the method comprising:
forming an active electrode consisting of an active electrode material;
forming a first noble electrode in contact with the active electrode, the first noble electrode being a patterned electrode comprising a noble electrode material;
forming a resistive switching layer in contact with the active electrode and the first noble electrode; and
forming a second noble electrode comprising a noble electrode material, the second noble electrode in contact with the resistive switching layer;
wherein the first noble electrode comprises a grid comprising a plurality of openings;
wherein the first noble electrode is configured to block current from flowing through;
wherein portions of the resistive switching layer in contact with the active electrode, and extending within the plurality of openings of the grid form conduction channels such that one or more conduction paths are formed in the conduction channels when a potential difference is applied along one direction across the resistive switching layer;
wherein the active electrode material is selected from a group consisting of titanium (Ti), nickel (Ni), tantalum (Ta), hafnium (Hf), and aluminum (Al) such that the active electrode and the resistive switching layer form a Schottky barrier of 1.1 eV or below; and
wherein the first noble electrode and the resistive switching layer form a Schottky barrier of 1.2 eV or above.

9. The method according to claim 8,
wherein the active electrode is formed before the first noble electrode is formed on the active electrode;
wherein the resistive switching layer is formed in contact with the active electrode and the first noble electrode after forming the active electrode and the first noble electrode; and
wherein the second noble electrode is formed on the resistive switching layer after the resistive switching layer is formed.

10. The method according to claim 8, wherein the second noble electrode is formed by any one deposition process selected from a group consisting of atomic layer deposition (ALD), chemical vapor deposition (CVD), pulsed laser deposition (PLD), and sputtering.

* * * * *